(12) United States Patent
Choi et al.

(10) Patent No.: US 11,522,092 B2
(45) Date of Patent: *Dec. 6, 2022

(54) SOLAR CELL MODULE

(71) Applicant: Shangrao Jinko Solar Technology Development Co., LTD, Jiangxi Province (CN)

(72) Inventors: Yoonsuk Choi, Seoul (KR); Jinsung Kim, Seoul (KR); Haejong Cho, Seoul (KR); Donghae Oh, Seoul (KR); Youngsik Lee, Seoul (KR); Sunghyun Hwang, Seoul (KR); Hyunho Lee, Seoul (KR); Wondoo Song, Seoul (KR)

(73) Assignee: Shangrao Jinko solar Technology Development Co., LTD, Jiangxi Province (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/522,085

(22) Filed: Nov. 9, 2021

(65) Prior Publication Data

US 2022/0069144 A1     Mar. 3, 2022

Related U.S. Application Data

(63) Continuation of application No. 16/179,613, filed on Nov. 2, 2018, now Pat. No. 11,201,252, which is a
(Continued)

(30) Foreign Application Priority Data

Jun. 26, 2014  (KR) ........................ 10-2014-0079260
Aug. 4, 2014   (KR) ........................ 10-2014-0100090

(51) Int. Cl.
*H01L 31/0224* (2006.01)
*H02S 30/10* (2014.01)
(Continued)

(52) U.S. Cl.
CPC .. *H01L 31/022433* (2013.01); *H01L 31/0201* (2013.01); *H01L 31/02013* (2013.01);
(Continued)

(58) Field of Classification Search
CPC ......... H01L 31/022433; H01L 31/0201; H01L 31/02013; H01L 31/05; H01L 31/0504; H01L 31/0508; H01L 31/0512
See application file for complete search history.

(56) References Cited

U.S. PATENT DOCUMENTS 5,011,544 A      4/1991  Gaddy et al.
2003/0006730 A1  1/2003  Tachibana
(Continued)

FOREIGN PATENT DOCUMENTS

CN    101675530    3/2010
CN    101919066    12/2010
(Continued)

OTHER PUBLICATIONS

Chinese Office Action in Chinese Appln. No. 201710975923.2, dated Dec. 25, 2018, 13 pages (with English translation).
(Continued)

*Primary Examiner* — Lindsey A Bernier
(74) *Attorney, Agent, or Firm* — Pillsbury Winthrop Shaw Pittman LLP

(57) ABSTRACT

A solar cell module includes an upper substrate, a lower substrate opposite the upper substrate, a solar cell panel positioned between the upper substrate and the lower substrate, the solar cell panel including a plurality of solar cells which are arranged in a matrix form and are connected to one another through a wiring member, a passivation layer configured to package the solar cell panel, a frame configured to surround an outer perimeter of the solar cell panel, a connection terminal configured to connect two adjacent
(Continued)

strings in the solar cell panel, and a cover member configured to cover the connection terminal.

15 Claims, 24 Drawing Sheets

Related U.S. Application Data continuation of application No. 14/752,561, filed on Jun. 26, 2015, now Pat. No. 10,164,130.

(51) Int. Cl.
  *H01L 31/05* (2014.01)
  *H01L 31/02* (2006.01)
  *H01L 31/048* (2014.01)

(52) U.S. Cl.
  CPC .......... *H01L 31/05* (2013.01); *H01L 31/0504* (2013.01); *H01L 31/0508* (2013.01); *H01L 31/0512* (2013.01); *H02S 30/10* (2014.12); *H01L 31/048* (2013.01); *Y02E 10/50* (2013.01); *Y02E 10/52* (2013.01)

(56) References Cited

U.S. PATENT DOCUMENTS

| | | | |
|---|---|---|---|
| 2006/0272843 A1 | 12/2006 | Berghoffer et al. |
| 2007/0095387 A1 | 5/2007 | Fujii et al. |
| 2007/0125415 A1 | 6/2007 | Sachs |
| 2009/0014060 A1 | 1/2009 | Nakatani et al. |
| 2009/0025778 A1 | 1/2009 | Rubin et al. |
| 2010/0000602 A1 | 1/2010 | Gray et al. |
| 2010/0132768 A1 | 6/2010 | Ito et al. |
| 2010/0243024 A1 | 9/2010 | Hashimoto |
| 2010/0275976 A1 | 11/2010 | Rubin et al. |
| 2011/0017281 A1 | 1/2011 | Funakoshi et al. |
| 2011/0174354 A1 | 7/2011 | Kutzer et al. |
| 2011/0253191 A1 | 10/2011 | Kutzer et al. |
| 2011/0265844 A1 | 11/2011 | Storbeck |
| 2012/0080068 A1 | 4/2012 | Bae et al. |
| 2012/0125396 A1 | 5/2012 | Taira et al. |
| 2013/0133725 A1 | 5/2013 | Nakatani |
| 2015/0381109 A1 | 12/2015 | Choi et al. |
| 2017/0012146 A1 | 1/2017 | Choi et al. |

FOREIGN PATENT DOCUMENTS

| | | |
|---|---|---|
| CN | 102428572 | 4/2012 |
| CN | 203277411 | 11/2013 |
| DE | 102012207168 | 10/2013 |
| EP | 2924740 | 9/2015 |
| JP | 8-330615 | 12/1996 |
| JP | 2000277771 | 10/2000 |
| JP | 2004335705 | 11/2004 |
| JP | 200954981 | 3/2009 |
| JP | 2009246208 | 10/2009 |
| JP | 2011507275 | 3/2011 |
| JP | 2011507282 | 3/2011 |
| JP | 2011205146 | 10/2011 |
| JP | 2012109600 | 6/2012 |
| JP | 2012156460 | 8/2012 |
| JP | 2012182472 | 9/2012 |
| JP | 2012204666 | 10/2012 |
| JP | 201417529 | 1/2014 |
| JP | 201463978 | 4/2014 |
| JP | 2014103301 | 6/2014 |
| JP | 2015506108 | 2/2015 |
| KR | 20060105535 | 10/2006 |
| KR | 1020130117161 | 10/2013 |
| WO | WO2013090562 | 6/2013 |
| WO | WO2013100856 | 7/2013 |
| WO | WO2014045909 | 3/2014 |
| WO | WO2014080894 | 5/2014 |

OTHER PUBLICATIONS

KR Office Action in Korean Appln. No. 10-2014-0100090, dated Mar. 16, 2021, 8 pages (with English translation).
Soderstrom et al., "Smart Wire Connection Technology," 28th European Photovoltaic Solar Energy Conference and Exhibition, Mar. 29, 2019, 6 pages.
Notice of Allowance for Korean Application No. 10-2014-0100090, dated Jul. 13, 2022, 4 pages (with English translation).

| width(um) | no. | power(W) |
|---|---|---|
| 250 | 6 | -24.43965843 |
| | 8 | -13.54504888 |
| | 10 | -7.24868421 |
| | 12 | -3.231078956 |
| | 14 | -0.508151484 |
| | 16 | 1.408863161 |
| | 18 | 2.7902069 |
| | 20 | 3.797442507 |
| | 22 | 4.533093875 |
| | 24 | 5.065355847 |
| | 26 | 5.441352519 |
| | 28 | 5.694691597 |
| | 30 | 5.84998615 |
| 300 | 6 | -13.62573777 |
| | 8 | -5.538606589 |
| | 10 | -0.946615758 |
| | 12 | 1.918163 |
| | 14 | 3.803429666 |
| | 16 | 5.079758368 |
| | 18 | 5.951729454 |
| | 20 | 6.541508753 |
| | 22 | 6.926549371 |
| | 24 | 7.158332294 |
| | 26 | 7.272410484 |
| | 28 | 7.294126551 |
| | 30 | 7.24203249 |

| width(um) | no. | power(W) |
|---|---|---|
| 340 | 6 | -8.227259286 |
| | 8 | -1.567954334 |
| | 10 | 2.151425044 |
| | 12 | 4.42119535 |
| | 14 | 5.870080081 |
| | 16 | 6.809165124 |
| | 18 | 7.409981798 |
| | 20 | 7.774866517 |
| | 22 | 7.968653666 |
| | 24 | 8.034411746 |
| | 26 | 8.001869693 |
| | 28 | 7.892210095 |
| | 30 | 7.720934265 |
| 360 | 6 | -6.191219388 |
| | 8 | -0.078969114 |
| | 10 | 3.304217953 |
| | 12 | 5.343224781 |
| | 14 | 6.621589068 |
| | 16 | 7.427803799 |
| | 18 | 7.920848681 |
| | 20 | 8.195529157 |
| | 22 | 8.311887178 |
| | 24 | 8.309796287 |
| | 26 | 8.216773524 |
| | 28 | 8.052421552 |
| | 30 | 7.831083071 |

| width(um) | no. | power(W) |
|---|---|---|
| 400 | 6 | -3.022168956 |
| | 8 | 2.223217705 |
| | 10 | 5.070364754 |
| | 12 | 6.738738359 |
| | 14 | 7.740983303 |
| | 16 | 8.330146108 |
| | 18 | 8.645514 |
| | 20 | 8.770076931 |
| | 22 | 8.756357901 |
| | 24 | 8.639217818 |
| | 26 | 8.442703433 |
| | 28 | 8.183938629 |
| | 30 | 7.875448335 |
| 500 | 6 | 1.729565268 |
| | 8 | 5.6059712 |
| | 10 | 7.59191103 |
| | 12 | 8.652949892 |
| | 14 | 9.192917827 |
| | 16 | 9.410453978 |
| | 18 | 9.414619243 |
| | 20 | 9.270267767 |
| | 22 | 9.018381577 |
| | 24 | 8.686127593 |
| | 26 | 8.292225951 |
| | 28 | 7.849995807 |
| | 30 | 7.369171949 |

| width(um) | IC NO. (min) | IC NO. (max) |
|---|---|---|
| 250 | 15 | 33 |
| 300 | 11 | 28 |
| 340 | 9 | 24 |
| 360 | 9 | 23 |
| 400 | 7 | 21 |
| 500 | 6 | 17 |

SOLAR CELL MODULE

CROSS-REFERENCE TO RELATED APPLICATION

This application is a continuation of U.S. application Ser. No. 16/179,613, filed on Nov. 2, 2018, which is a continuation of U.S. application Ser. No. 14/752,561, filed on Jun. 26, 2015, (now U.S. Pat. No. 10,164,130), which claims priority to and the benefit of Korean Patent Application No. 10-2014-0079260, filed on Jun. 26, 2014, and Korean Patent Application No. 10-2014-0100090, filed on Aug. 4, 2014, the entire contents of which are incorporated herein by reference.

BACKGROUND OF THE INVENTION

Field of the Invention

Embodiments of the invention relate to a solar cell module.

Description of the Related Art

A solar cell is an electricity generating device obtaining photovoltaic power using a photoelectric effect. In the solar cell, electrons and holes produced in a semiconductor substrate forming a p-n junction are respectively collected by an n-type electrode and a p-type electrode. Further, the solar cell includes a back surface field region forming a potential barrier between the semiconductor substrate and the electrodes, and the back surface field region is formed by heavily doping impurities of the same conductive type as the semiconductor substrate.

The adjacent solar cells having the above-described configuration are connected through an interconnector to form a solar cell module. A solar cell assembly is formed by sealing the solar cell module using an upper substrate and a lower substrate. The solar cell assembly is installed outside and is used in the solar power generation.

SUMMARY OF THE INVENTION

Embodiments of the invention provide a solar cell module capable of improving a photoelectric conversion efficiency and a design.

In one aspect, there is a solar cell module comprising an upper substrate; a lower substrate opposite the upper substrate; a solar cell panel positioned between the upper substrate and the lower substrate, the solar cell panel including a plurality of solar cells which are arranged in a matrix form and are connected to one another through a wiring member; a passivation layer configured to package the solar cell panel; a frame configured to surround an outer perimeter of the solar cell panel; a connection terminal configured to connect two adjacent strings in the solar cell panel; and a cover member configured to cover the connection terminal.

The cover member may be formed of the same material as the lower substrate.

A surface of the cover member may be an inclined surface including uneven portions.

The cover member is positioned between the upper substrate and the lower substrate and is packaged by the passivation layer.

The cover member is positioned on a surface of the upper substrate.

The cover member is formed by coating a surface of the connection terminal.

The connection terminal is formed of the same material as an electrode of the solar cell or is formed of the same material as the wiring member.

The connection terminal has a shape different from the wiring member and includes a core layer and a coating layer coating the core layer like the wiring member.

The wiring member has a wire shape having a width of 0.24 mm to 0.53 mm, and the 10 to 18 wiring members connect two adjacent solar cells.

One end of the wiring member is connected to electrodes formed on a front surface of a first solar cell of the two adjacent solar cells, and the other end is connected to electrodes formed on a back surface of a second solar cell of the two adjacent solar cells.

The wiring members, which are two times more than a number of wiring members used to connect the two adjacent solar cells, are connected to the connection terminal.

In another aspect, there is a solar cell module comprising an upper substrate; a lower substrate opposite the upper substrate; a solar cell panel positioned between the upper substrate and the lower substrate, the solar cell panel including a plurality of solar cells which are arranged in a matrix form and are connected to one another through a wiring member; a passivation layer configured to package the solar cell panel; a frame configured to surround an outer perimeter of the solar cell panel; and a connection terminal positioned on a back surface of the lower substrate and configured to connect two adjacent strings.

The connection terminal is sandwiched between the frame and the solar cell panel.

The solar cell module may further comprise a lead hole configured to pass through the passivation layer and the frame. Another wiring member connected to each of the two adjacent strings is connected to the connection terminal through the lead hole.

Another wring member connected to each of the two adjacent strings surrounds the outer perimeter of the solar cell panel and is connected to the connection terminal.

The connection terminal is formed of the same material as an electrode of the solar cell or is formed of the same material as the wiring member.

The wiring member has a wire shape having a width of 0.24 mm to 0.53 mm, and the 10 to 18 wiring members connect two adjacent solar cells.

One end of the wiring member is connected to electrodes formed on a front surface of a first solar cell of the two adjacent solar cells, and the other end is connected to electrodes formed on a back surface of a second solar cell of the two adjacent solar cells.

The wiring members, which are two times more than a number of wiring members used to connect the two adjacent solar cells, are connected to the connection terminal.

In yet another aspect, there is a solar cell module comprising a plurality of solar cells each including a semiconductor substrate, an emitter region forming a p-n junction along with the semiconductor substrate, a first electrode connected to the emitter region, and a second electrode connected to a back surface of the semiconductor substrate; and a plurality of wiring members connected to the first electrode or the second electrode and configured to electrically connect the plurality of solar cells in series, wherein a number of wiring members connected to the first electrode or the second electrode of each solar cell is 6 to 30, and wherein a width of each wiring member is equal to or greater than the following Function 1, "x=3.1101× y2−90.552xy+

911.2", and is equal to or less than the following Function 2, "x=0.7225× y2−51.38×y+1162.1", where x is the width of the wiring member, and y is the number of wiring members.

The number of wiring members may be 9 to 23.

The number of wiring members may be 10 to 18.

The first electrode includes a plurality of front fingers configured to extend in one direction in parallel with one another, and a plurality of pads formed at crossings of the plurality of front fingers and the plurality of wiring members.

The solar cell module may further comprise a connection electrode configured to connect the plurality of pads in a direction crossing the plurality of front fingers.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 29 is a table showing a comparison between an amount of electricity generated by a solar cell depending on changes in a diameter of a wiring member and the number of wiring members and a comparative example;

DETAILED DESCRIPTION OF THE EMBODIMENTS

Arrangements and embodiments may now be described more fully with reference to the accompanying drawings, in which exemplary embodiments may be shown. Embodiments may, however, be embodied in many different forms and should not be construed as being limited to embodiments set forth herein; rather, embodiments may be provided so that this disclosure will be thorough and complete, and will fully convey the concept to those skilled in the art.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the arts can mislead the embodiments of the invention.

Figure 1:
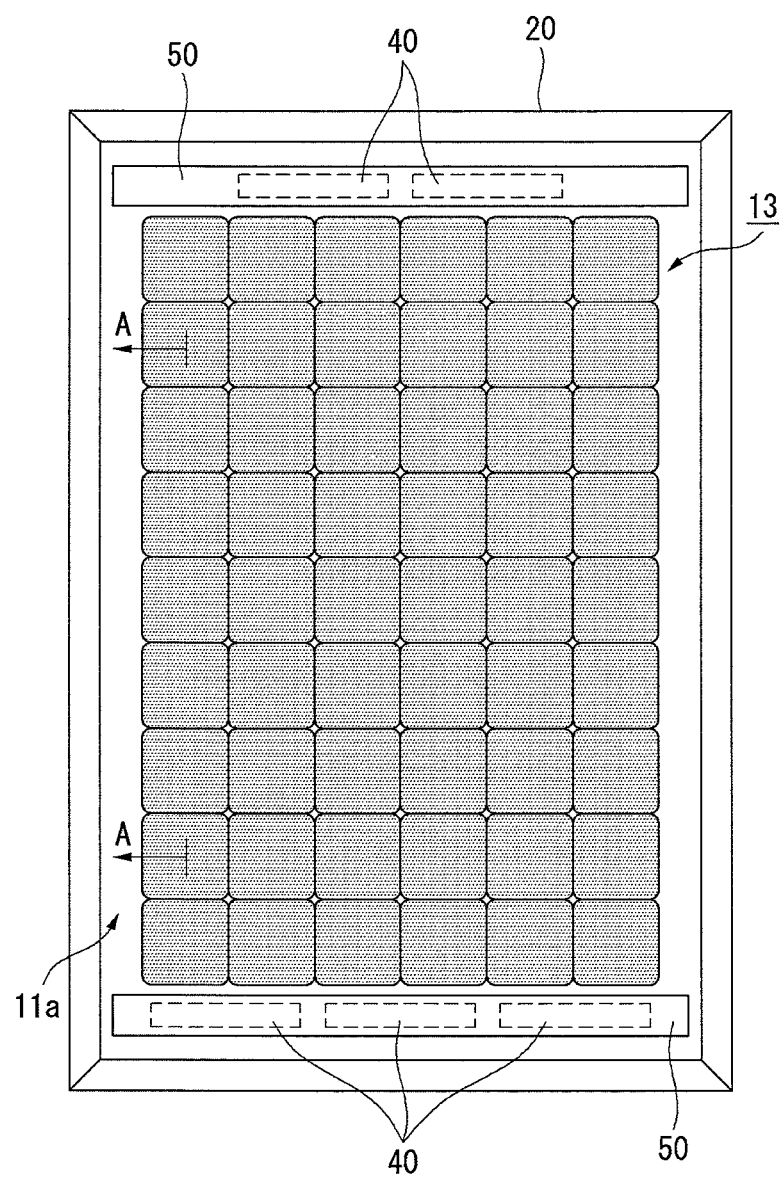
FIG. 1 is a plane view of a solar cell module according to an exemplary embodiment of the invention.
Figure 2:
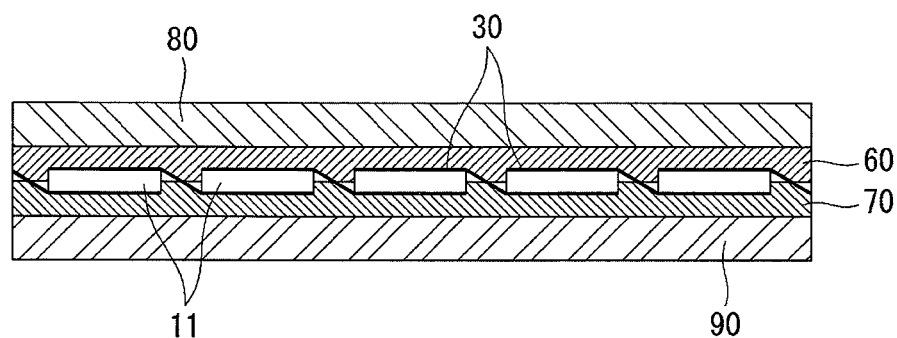
FIG. 2 is a cross-sectional view taken along line A-A of FIG. 1.

FIG. 1 is a plane view of a solar cell module according to an exemplary embodiment of the invention. FIG. 2 is a cross-sectional view taken along line A-A of FIG. 1.

As shown in FIGS. 1 and 2, a solar cell module according to the embodiment of the invention includes a solar cell panel 13 and a frame 20 supporting the solar cell panel 13.

The frame 20 has a shape surrounding the perimeter of the solar cell panel 13 and is coupled with the solar cell panel 13. The frame 20 is made of a light metal material, for example, stainless steel or aluminum.

The solar cell panel 13 is configured by arranging a plurality of solar cells 11 in a matrix form and electrically connecting the plurality of solar cells 11. The plurality of solar cells 11 are connected to one another through wiring members 30 to form a string 11a of one row. The plurality of strings 11a are electrically connected to one another to form the solar cell panel 13. FIG. 1 shows that nine solar cells form one string 11a, and six strings 11a are connected to one another through connection terminals 40 to form the solar cell panel 13, as an example.

The connection terminal 40 is disposed between the solar cell panel 13 and the frame 20 (i.e., on the upper and lower sides of the solar cell panel 13) and electrically connects the two adjacent strings. A cover member is positioned on the connection terminal 40, and thus the connection terminal 40 is not seen outside. This is described later.

As shown in FIG. 2, the solar cell panel 13 is sandwiched between an upper substrate 80 corresponding to a front surface (for example, an incident surface) and a lower substrate 90 corresponding to a back surface. A transparent upper passivation layer 60 and a transparent lower passivation layer 70 positioned between the upper substrate 80 and the lower substrate 90 may be formed of ethylene vinyl acetate (EVA) and package the solar cell panel 13. The embodiment of the invention describes that the upper substrate 80 and the lower substrate 90 are separated from each other. However, the passivation layers 60 and 70 may be formed by thermally processing a liquid material. Alternatively, the passivation layers 60 and 70 may be formed by gelling the passivation layers 60 and 70 of a sheet type. In this instance, the passivation layers 60 and 70 may form a single layer unlike the embodiment of the invention.

The upper substrate 80 is a transparent insulating substrate and is preferably formed of a tempered glass. The tempered glass may be a low iron tempered glass containing a small amount of iron. The upper substrate 80 may have an uneven inner surface so as to increase a scattering effect of light.

The lower substrate 90 may include a plurality of functional layers including a moisture/oxygen penetrating prevention layer, a chemical corrosion prevention layer, an insulation layer, etc., so as to prevent moisture and oxygen from penetrating into the solar cell panel 13 and protect the solar cell panel 13 from an external environment. The plurality of functional layers may have a single-layered structure.

A front electrode positioned on a front surface of the solar cell 11 on one line is connected to a back electrode positioned on a back surface of the solar cell 11 on a next line through the wiring member 30.

Figure 3:
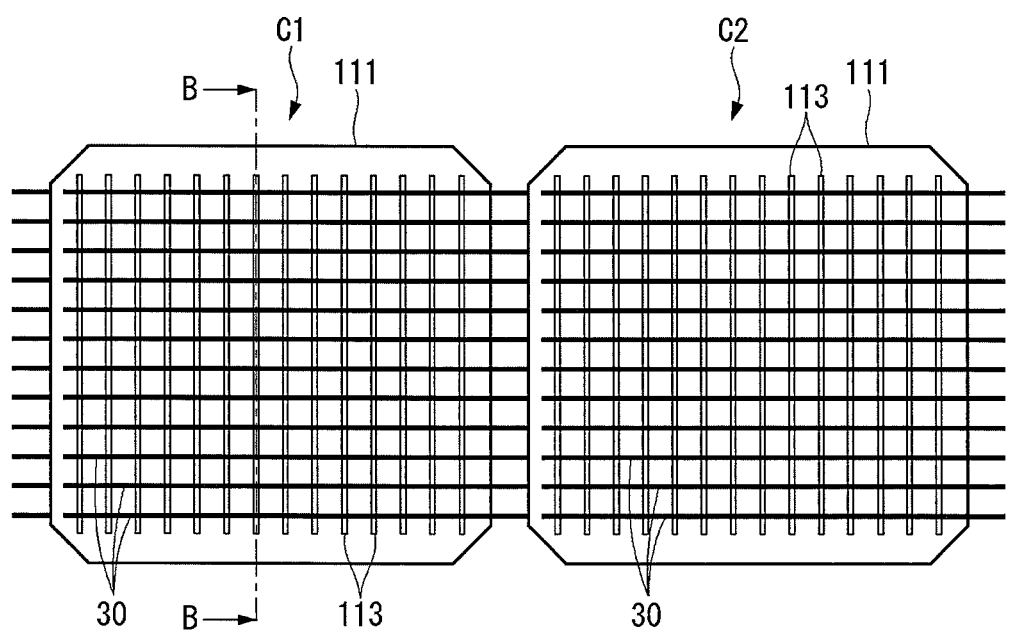
FIG. 3 is a plane view of solar cells connected to wiring members.
Figure 4:
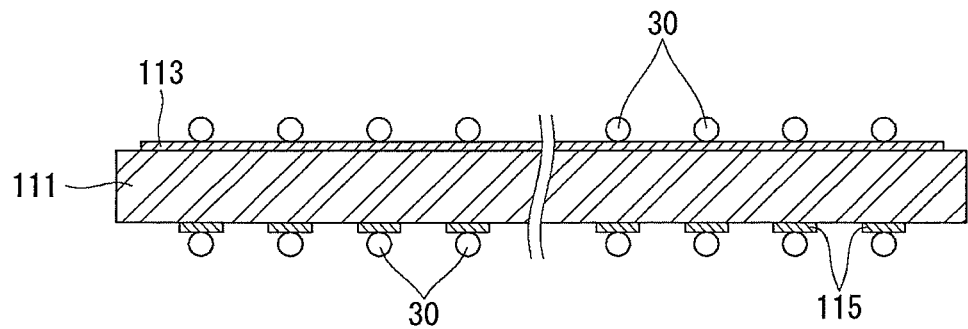
FIG. 4 is a cross-sectional view taken along line B-B of FIG. 3.

FIG. 3 is a plane view of solar cells connected to wiring members, and FIG. 4 is a cross-sectional view taken along line B-B of FIG. 3.

As shown in FIGS. 3 and 4, the solar cell 11 has a conventional structure, in which electrodes are respectively positioned on a front surface and a back surface of a semiconductor substrate 111.

The semiconductor substrate 111 forms a p-n junction and is an n-type or p-type semiconductor substrate containing impurities of a first conductive type.

Front electrodes 113 are positioned on the front surface of the semiconductor substrate 111, and back electrodes 115 are positioned on the back surface of the semiconductor substrate 111. The front electrode 113 and the back electrode 115 respectively collect carriers of opposite polarities.

The front electrodes 113 and the back electrodes 115 are formed in a crossing direction therebetween. For example, the front electrodes 113 are formed in parallel with one another in a vertical direction, and the back electrodes 115 are formed in parallel with one another in a horizontal direction.

An emitter region and a back surface field region reducing a potential barrier and a passivation layer preventing a recombination of carriers at the surface are formed between the semiconductor substrate 111 and the front electrodes 113 or the back electrode 115. However, the above components were omitted in the drawing.

The two adjacent solar cells 11 (or C1 and C2) having the above-described configuration are connected to each other through the wiring members 30. As shown in (A) of FIG. 5, the wiring member 30 has a wire shape. (B) of FIG. 5 shows a cross section of the wiring member 30.

Figure 5:
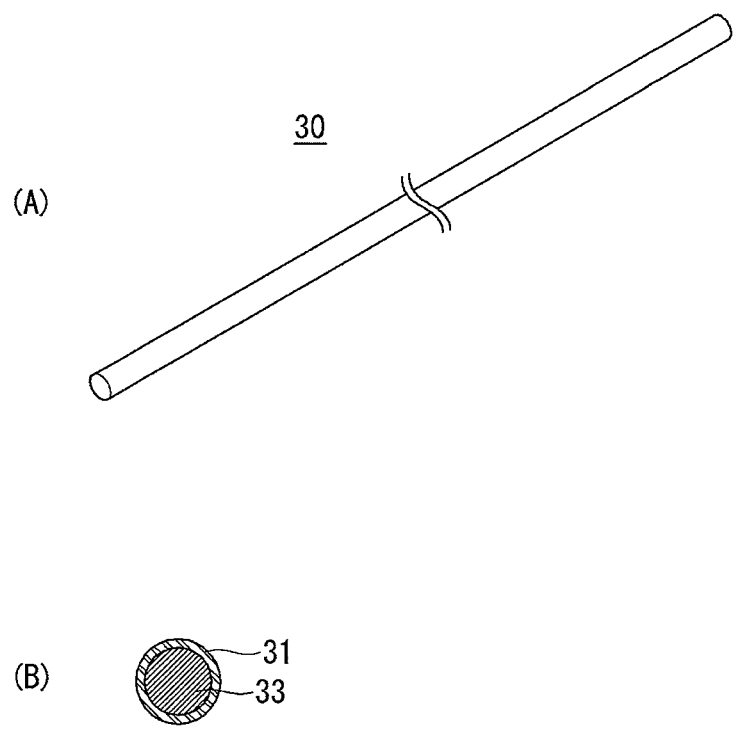
FIG. 5 shows a shape of a wiring member.

As shown in FIG. 5, the wiring member 30 has a structure, in which a coating layer 33 is coated on a core layer 31 with a thin thickness (for example, about 12 μm or less). The entire thickness of the wiring member 30 is 300 μm to 500 μm.

The core layer 31 is formed of a metal material with the good conductivity, for example, Ni, Cu, Ag, and Al. The coating layer 33 is formed of a metal material having a chemical formula of Pb, Sn or SnIn, SnBi, SnPb, Sn, SnCuAg, SnCu, etc., or a combination thereof.

Thus, the wiring member 30 may be easily connected to the electrodes 113 and 115 through the soldering.

When the two adjacent solar cells C1 and C2 are connected, the 10 to 18 wiring members 30 may be used in case of the semiconductor substrate 111 having the size of 156 mm*156 mm. The number of wiring members 30 may vary depending on the size of the semiconductor substrate 111, the structure of the electrode, etc. This is described in detail later.

One side of the wiring member 30 used to connect the two adjacent solar cells C1 and C2 is connected to the front electrode 113 of the first solar cell C1, and the other side is connected to the back electrode 115 of the second solar cell C2. Hence, the front electrode 113 and the wiring member 30 are disposed in a crossing direction therebetween and are connected to each other. Further, the back electrode 115 and the wiring member 30 are disposed in parallel with each other and are connected to each other.

An example of a connection method respectively positions the wiring members 30 on the front surfaces and the back surfaces of the two adjacent solar cells C1 and C2 so that the wiring members 30 are opposite to the front electrode 113 and the back electrode 115, and heats the coating layers 33 of the wiring members 30 at a temperature equal to or higher than a melting temperature for several seconds. Hence, as the coating layer 33 is melted and cooled, the wiring members 30 are attached to the electrodes 113 and 115.

Figure 6:
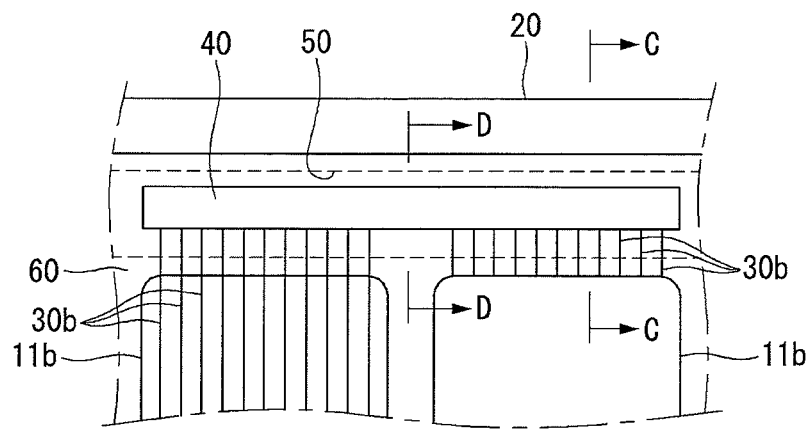
FIG. 6 shows that two adjacent strings are connected through a connection terminal.
Figure 7:
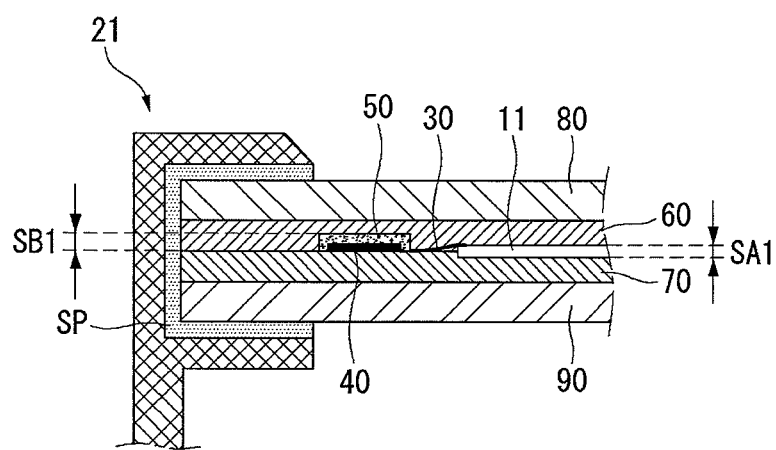
FIG. 7 is a cross-sectional view taken along line C-C of FIG. 6.

FIG. 6 shows that two adjacent strings are connected through the connection terminal 40, and FIG. 7 is a cross-sectional view taken along line C-C of FIG. 6.

Referring to FIGS. 6 and 7, the connection terminal 40 is packaged by the upper passivation layer 60 and the lower passivation layer 70, and a cover member 50 is positioned on the connection terminal 40. Hence, the connection terminal 40 is not seen outside.

The perimeter of the solar cell panel 13 is surrounded by a frame 20 with a sealant SP formed of an insulating material interposed therebetween. The sealant SP may be an insulating resin or an insulating tape, on which the thermal processing is easily performed. The frame 20 is made of a light metal material such as aluminum and stainless steel. The frame 20 includes a ⊏-shaped flange 21 having a hollow in the center. The frame 20 is easily coupled with the solar cell panel 13 by inserting the flange 21 into the perimeter of the solar cell panel 13.

The connection terminal 40 is positioned between the frame 20 and the solar cell panel 13 and on the upper passivation layer 60. The connection terminal 40 is formed of a conductive metal material. For example, the connection terminal 40 may be formed of the same metal material (for example, silver (Ag)) as the electrodes 13 and 15, or may be formed of the same material as the wiring member 30.

The connection terminal 40 has a rectangular band shape or ribbon like shape as conventional bus ribbon having a thin thickness. A width of the connection terminal 40 is less than a sum of horizontal widths of the two adjacent solar cells 11a and 11b and is greater than a sum of widths of all of the wiring members 30 drawn from at least two solar cells 11a and 11b.

As shown, the connection terminal 40 has a rectangular plane shape and extends in a direction crossing the wiring member 30. Thus, the connection terminal 40 can be connected to all of the wiring members 30 drawn from the solar cells 11a and 11b.

FIGS. 6 and 7 show the connection terminal 40 having the rectangular band shape, as an example. Thus, other shapes may be used for the connection terminal 40. For example, the connection terminal 40 may have a wire shape in the same manner as the wiring member 30. Herein, the wiring member 30 may have a circular cross-section that a width of the wiring member 30 equals to a thickness of the wiring member 30.

And, the rectangular band shape may be a ribbon type that a width of the rectangular band shape is greater than a thickness of the rectangular band shape.

The connection terminal 40 may include a core layer and a coating layer in the same manner as the wiring member 30. Materials forming the core layer and the coating layer of the connection terminal 40 may be different from the materials forming the core layer and the coating layer of the wiring member 30. Because a thickness, a width, a length, etc. of the connection terminal 40 are different from those of the wiring member 30, a shape of the connection terminal 40 may be different from a shape of the wiring member 30. In the present invention, basically, it is prefers that the thickness or the width of the connection terminal 40 is greater than those of the wiring member 30.

First wiring members 30a extend to the connection terminal 40 connected to the front electrodes 113 of the last solar cell 11a of the plurality of solar cells constituting a string of a first row. Second wiring members 30b extend to the connection terminal 40 connected to the back electrodes 115 of the first solar cell 11b of the plurality of solar cells constituting a string of a second row.

The first wiring members 30a and the second wiring members 30b are electrically connected to the connection terminal 40, and thus the strings of the first and second rows are electrically connected to each other. The first wiring members 30a and the second wiring members 30b are soldered to the connection terminal 40 or are electrically connected to the connection terminal 40 through a conductive adhesive of a liquid or solid state.

The above connection structure is equally applied to all of the strings. For example, as shown in FIG. 1, the two connection terminals 40 are disposed on the upper side of the solar cell panel 13 to connect strings of second and third rows and to connect strings of fourth and fifth rows. Further, the three connection terminals 40 are disposed on the lower side of the solar cell panel 13 to connect strings of the first and second rows, strings of the third and fourth rows, and strings of the fifth and sixth rows.

The passivation layers 60 and 70 are formed of a transparent insulating material, but the connection terminal 40 is formed of a metal material. Therefore, the connection terminal 40 may be easily seen. However, in the embodiment of the invention, the cover member 50 is positioned on the connection terminal 40 and covers the connection terminal 40.

A horizontal width and a vertical width of the cover member 50 are greater than those of the connection terminal 40, so that the cover member 50 completely covers the connection terminal 40. The cover member 50 is formed of an opaque material, so that the connection terminal 40 is not seen outside. It is preferable, but not required, that the cover member 50 is formed of the same material as the lower substrate 90 so that the cover member 50 has the same color as the lower substrate 90. In this instance, because the cover member 50 is formed of the same material as the lower substrate 90, the cover member 50 as well as the connection terminal 40 are scarcely seen at the front. Hence, the design of the solar cell module is improved.

Further, the cover member 50 may be formed by coating a reflection material on the surface of an opaque synthetic resin, on which the shape processing is easily performed.

The cover member 50 may be attached using a double-sided tape or may be fixed using an adhesive. Alternatively, the cover member 50 may be fixed by gelling a liquid material or a sheet type material.

So far, the embodiment of the invention described that the cover member 50 is formed separately from the connection terminal 40 and covers the connection terminal 40. However, the cover member 50 may be formed by coating the surface of the connection terminal 40 with a coating material. In this instance, it is preferable that the cover member 50 has the same color as the lower substrate or has a black color.

Figure 8:
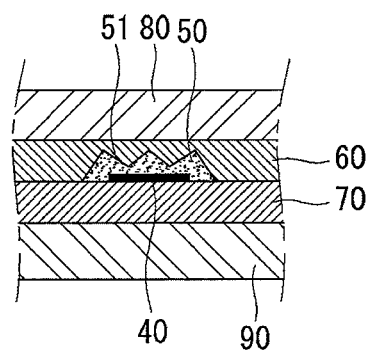
FIGS. 8 and 9 are cross-sectional views taken along line D-D of FIG. 6.

As shown in FIG. 8, the surface of the cover member 50 may include uneven portions 51. Because the cover member 50 includes the uneven portions 51, light may be reflected from the cover member 50 and may be transferred to the adjacent solar cell 11. It is preferable, but not required, that a thickness SB1 of the cover member 50 is greater than a thickness SA1 of the solar cell 11 so as to improve the reflection of light.

Figure 9:
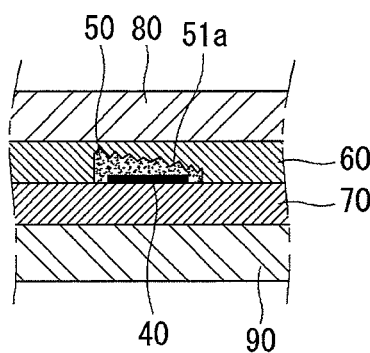

As shown in FIG. 9, the surface of the cover member 50 may have an inclined surface 51a. It is preferable, but not required, that the inclined surface 51a is configured as a falling inclined surface toward the adjacent solar cell. Uneven portions may be formed on the inclined surface 51a of the cover member 50, so as to improve the scattering of light.

Hence, light incident on the surface of the cover member 50 additionally bends by an angle corresponding to the falling inclined surface and is incident on the solar cell. Further, because the inclined surface 51a further includes the uneven portions, light is incident on the solar cell through various paths.

Figure 10:
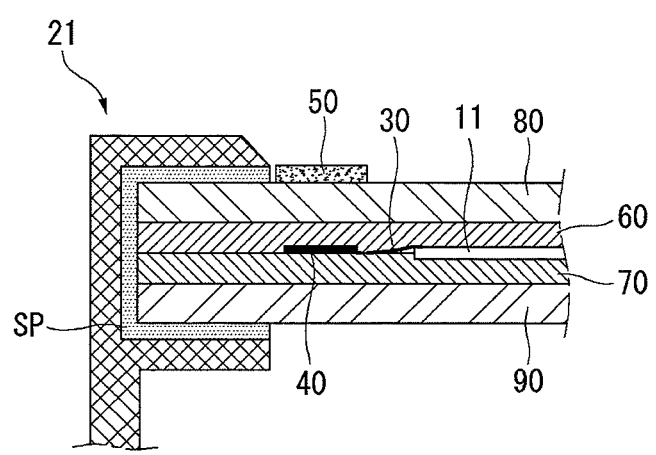
FIG. 10 shows that a cover member is formed on the surface of an upper substrate.

FIG. 10 shows that the cover member 50 is formed on the surface of the upper substrate 80 instead of the lower passivation layer 70. In general, the solar cell panel is formed by sequentially stacking the sheet type passivation layers 60 and 70 and the substrates 80 and 90 on and under the solar cells and laminating them in a stack state. Thus, as shown in FIG. 10, when the cover member 50 is formed on the surface of the upper substrate 80, the solar cell panel is manufactured in the same manner as a related art, and a simple process for attaching the cover member 50 manufactured in a tape type to the manufactured solar cell panel is performed. Therefore, the solar cell panel can be manufactured through the simple process without changes in the manufacturing process.

Figure 11:
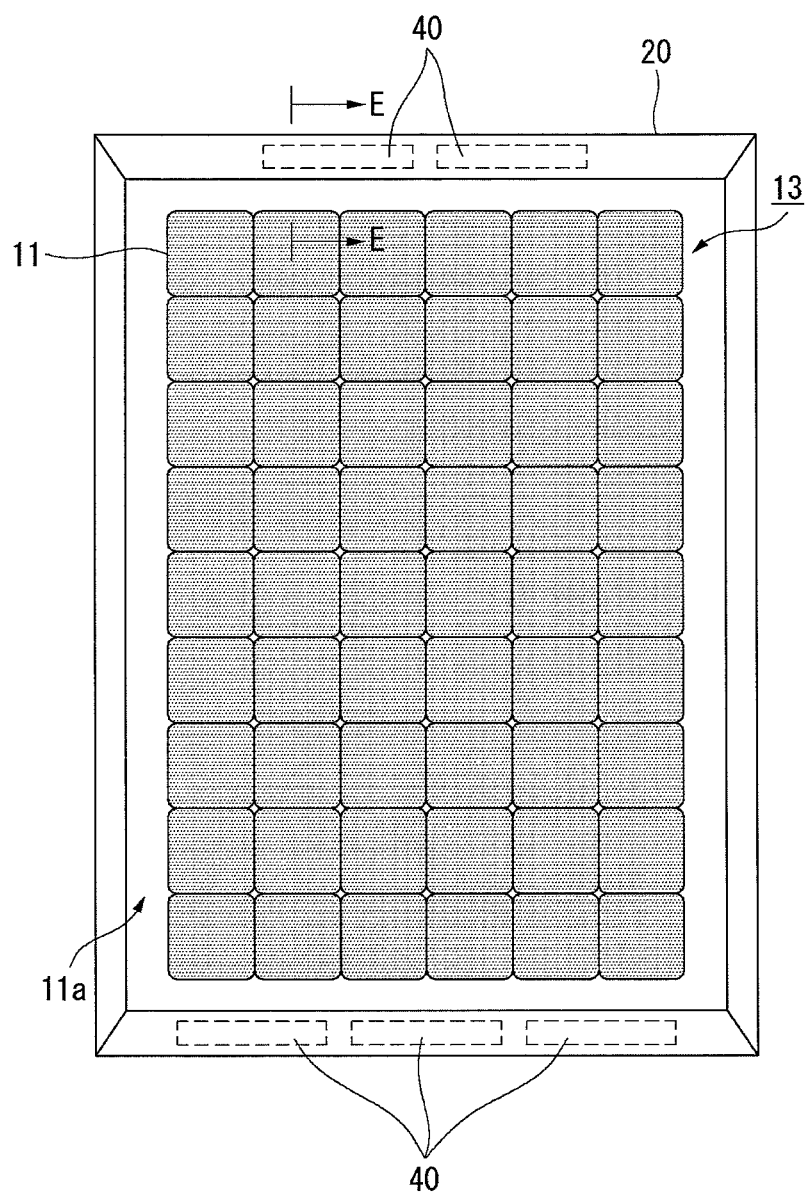
FIG. 11 shows a solar cell module according to another exemplary embodiment of the invention.
Figure 12:
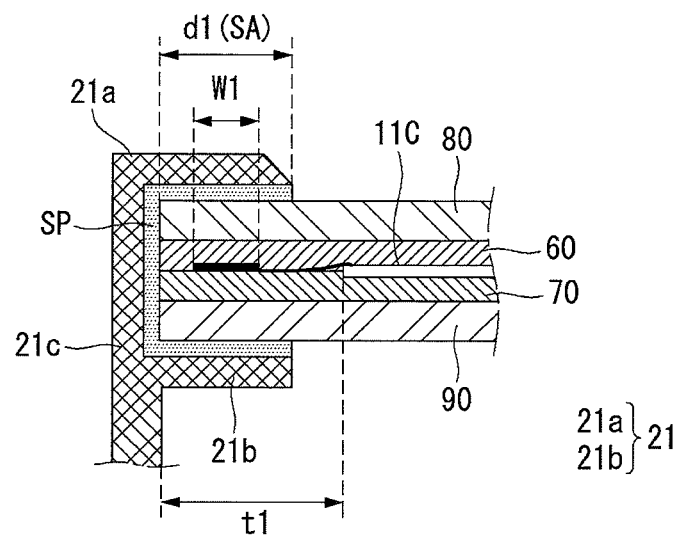
FIG. 12 is a cross-sectional view taken along line E-E of FIG. 11.

FIG. 11 shows a solar cell module according to another exemplary embodiment of the invention, and FIG. 12 is a cross-sectional view taken along line E-E of FIG. 11. The solar cell module shown in FIG. 11 is different from the solar cell module shown in FIG. 1 in that the cover member 50 is absent and connection terminals 40 are covered by a frame 20.

As shown in FIGS. 11 and 12, the connection terminals 40 are positioned on a lower passivation layer 70 at an end of the solar cell panel and are packaged by an upper passivation layer 60.

A flange 21 surrounds the outer perimeter of a solar cell panel 13 in a ⊏-shape. The flange 21 includes an upper leg 21a and a lower leg 21b.

The upper leg 21a protrudes from a body 21c by a predetermined distance in a horizontal direction and covers a portion of the upper side of the outer perimeter of the solar cell panel 13. The lower leg 21b protrudes from the body 21c by a predetermined distance in the horizontal direction. Thus, the outer perimeter of the solar cell panel 13 is sandwiched between the upper leg 21a and the lower leg 21b.

As described above, because the flange 21 surrounds the outer perimeter of substrates 80 and 90, an area corresponding to a predetermined distance dl is a bezel area SA covered by the flange 21. Because the flange 21 is made of a metal material, the bezel area SA is not seen.

In the embodiment of the invention, the connection terminal 40 is positioned in the bezel area SA. Therefore, the connection terminal 40 is not seen when viewed from the front of the solar cell module.

The connection terminal 40 has a first width W1, and the bezel area SA has a second width d1 greater than the first width W1. A distance t1 from the end of the solar cell panel to a first solar cell 11c of the string is greater than the first width W1 and the second width dl. It is preferable, but not required, that the width dl of the bezel area SA is equal to or greater than the width W1 of the connection terminal 40 and is equal to or less than the distance t1

Figure 13:
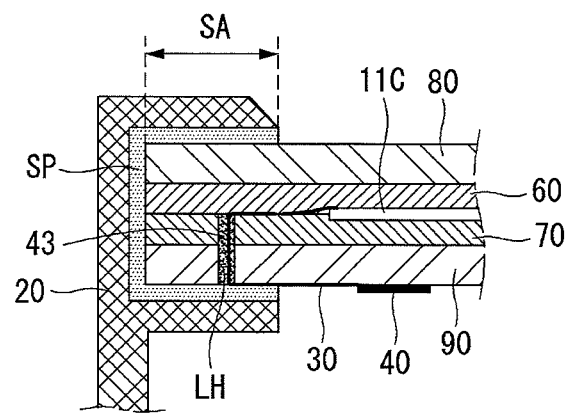
FIG. 13 shows that a connection terminal is positioned on a back surface of a solar cell panel.

FIG. 13 shows that the connection terminal 40 is positioned on a back surface of the solar cell panel unlike FIG. 12.

In the embodiment of the invention, the lower passivation layer 70 and the lower substrate 90 respectively include lead holes LH positioned on the same line, and the connection terminal 40 is positioned adjacent to the lead hole LH. The lead hole LH is positioned inside the bezel area SA and is not seen at the front of the solar cell module.

The wiring member 30 connected to the solar cell 11c is connected to the connection terminal 40 positioned on the back surface of the lower substrate 90 through the lead hole LH. Hence, the two adjacent strings are electrically connected through the connection terminal 40.

In the embodiment of the invention, the wiring member 30 is drawn to the outside through the lead hole LH. Therefore, it is preferable, but not required, that the lead hole LH is filled with an insulating member 43 so as to reduce a damage of the wiring member 30. For example, the insulating member 43 may be an insulating adhesive changing from a liquid state to a solid state, the same material as the passivation layer, or the same material as a sealant SP.

In the embodiment of the invention, as described above, the connection terminal 40 is positioned on the lower substrate 90, and the lower substrate 90 is opaque. Therefore, the connection terminal 40 is not seed at the front of the solar cell module. The configuration of FIG. 13 does not dispose the connection terminal 40 in the bezel area SA and disposes the connection terminal 40 on the back surface of the lower substrate 90 when compared to the configuration of FIG. 12, thereby implementing a slim bezel through a reduction in the bezel area SA.

Figure 14:
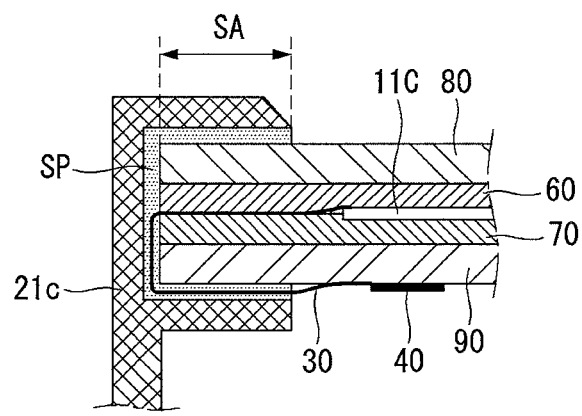
FIG. 14 shows that a solar cell is connected to a connection terminal without using a lead hole.

Configuration of FIG. 14 is different from the configuration of FIG. 13 in that the lead hole LH is absent. Even in the configuration of FIG. 14, the connection terminal 40 is positioned on the back surface of the solar cell panel.

As shown in FIG. 14, the wiring member 30 connected to the solar cell 11c is led out between the upper passivation layer 60 and the lower passivation layer 70. The wiring member 30 surrounds the perimeter of the solar cell panel and is drawn to the outside. Hence, the wiring member 30 is connected to the connection terminal 40.

In the configuration of FIG. 14, because the wiring member 30 is drawn to the connection terminal 40 in a state where the wiring member 30 is led out, the wiring member 30 may be easily broken by a physical impact, etc. It is preferable, but not required, that the wiring member 30 is drawn to the outside or is coated with an insulating material in a state the wiring member 30 is embedded in the sealant SP in consideration of this so that the wiring member 30 does not contact the lower substrate 90.

Figure 15:
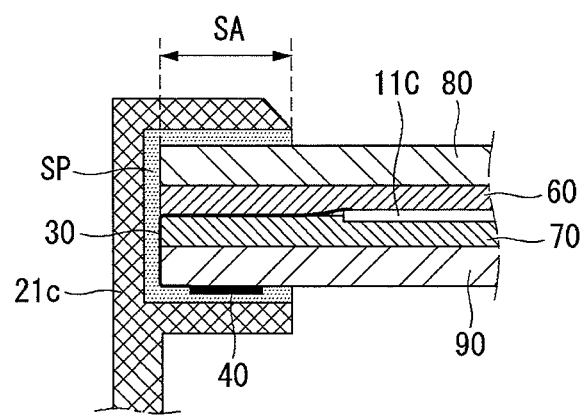
FIG. 15 shows that a connection terminal is sandwiched between a frame and a solar cell panel.

Configuration of FIG. 15 is substantially the same as the configuration of FIG. 14 except a position of the connection terminal 40.

As shown in FIG. 15, the connection terminal 40 is sandwiched between the lower leg 21b of the flange 21 and the lower substrate 90. In the configuration of FIG. 15, the wiring member 30 and the connection terminal 40 can be prevented from being disconnected by a physical impact applied to the connection terminal 40 by disposing the connection terminal 40 inside the flange 21 as described above.

So far, the embodiment of the invention described the solar cell module. Hereinafter, the embodiment of the invention describes the proper number of wiring members required to form the solar cell module.

Figure 16:
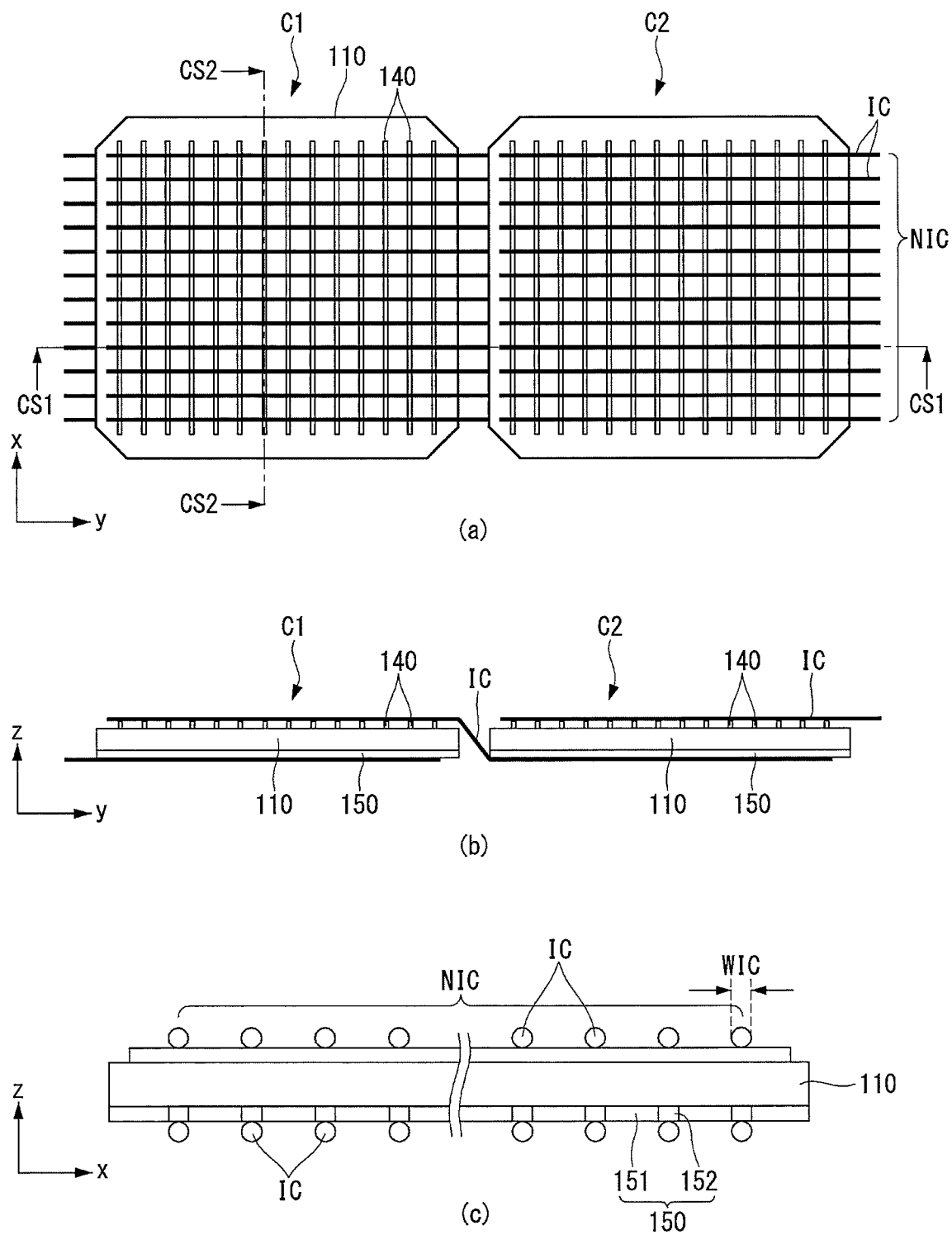
FIG. 16 shows an example of a solar cell module according to an exemplary embodiment of the invention.

FIG. 16 shows an example of a solar cell module according to the embodiment of the invention. More specifically, in FIG. 16, (a) shows the solar cell module according to the embodiment of the invention when viewed from the front of the solar cell module; (b) is a cross-sectional view taken along line CS1-CS1 of (a) of FIG. 16; and (c) is a cross-sectional view taken along line CS2-CS2 of (a) of FIG. 16.

Figure 17:
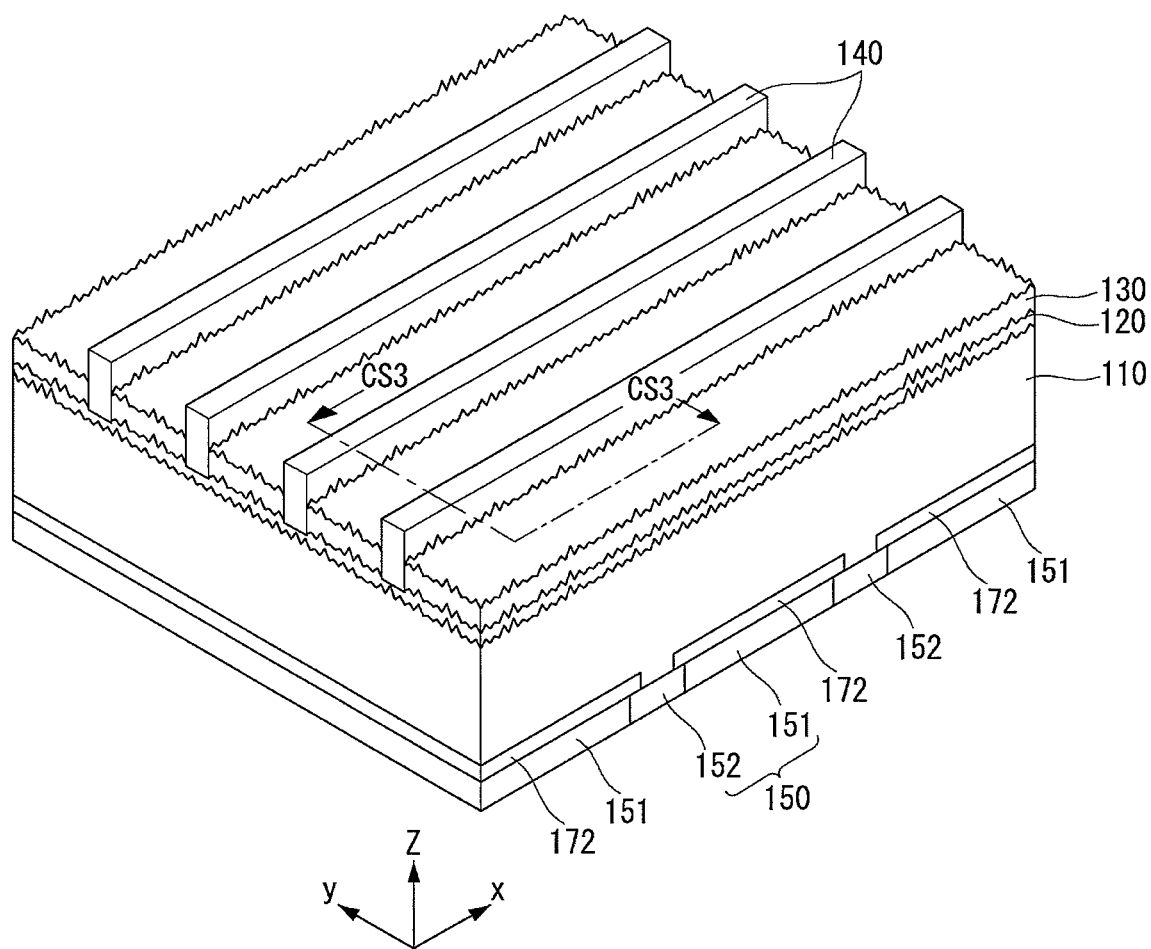
FIG. 17 is a partial perspective view showing an example of a solar cell applied to a solar cell module shown in FIG. 16.
Figure 18:
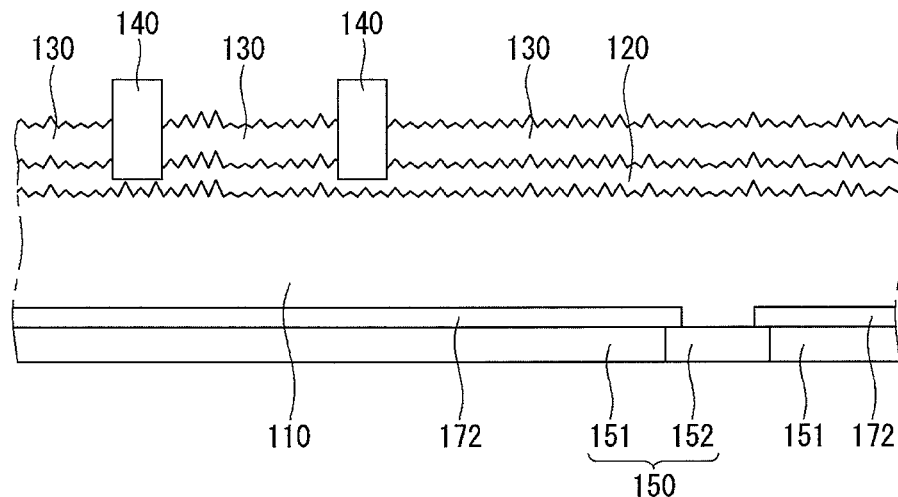
FIG. 18 is a cross-sectional view taken along line CS3-CS3 of FIG. 17.

FIG. 17 is a partial perspective view showing an example of a solar cell applied to the solar cell module according to the embodiment of the invention, and FIG. 18 is a cross-sectional view taken along line CS3-CS3 of FIG. 17.

As shown in FIG. 16, the solar cell module according to the embodiment of the invention includes a plurality of solar cells C1 and C2 and a plurality of wiring members IC connected to each of the solar cells C1 and C2.

As shown in FIGS. 17 and 18, an example of a solar cell applied to the solar cell module according to the embodiment of the invention may include a semiconductor substrate 110, an emitter region 120, an anti-reflection layer 130, a plurality of first electrodes 140, a plurality of back surface field (BSF) regions 172, and a second electrode 150.

The back surface field region 172 may be omitted, if necessary or desired. In the following description, the embodiment of the invention describes the solar cell including the back surface field region 172 as an example because the back surface field region 172 further improves the efficiency of the solar cell.

The semiconductor substrate 110 may be a semiconductor substrate formed of silicon of a first conductive type, for example, a p-type, though not required. Silicon used in the semiconductor substrate 110 may be single crystal silicon, polycrystalline silicon, or amorphous silicon. For example, the semiconductor substrate 110 may be formed of crystalline silicon wafer.

When the semiconductor substrate 110 is of the p-type, the semiconductor substrate 110 is doped with impurities of a group III element such as boron (B), gallium (Ga), and indium (In). Alternatively, the semiconductor substrate 110 may be of an n-type and/or may be formed of a semiconductor material other than silicon. If the semiconductor substrate 110 is of the n-type, the semiconductor substrate 110 may be doped with impurities of a group V element such as phosphorus (P), arsenic (As), and antimony (Sb).

A front surface of the semiconductor substrate 110 has a plurality of uneven portions. FIG. 17 shows that only an edge of the semiconductor substrate 110 has the uneven portions for the sake of brevity and ease of reading. Thus, FIG. 17 shows that only an edge of the emitter region 120 positioned on the front surface of the semiconductor substrate 110 has the uneven portions. However, in fact, the entire front surface of the semiconductor substrate 110 has the uneven portions, and the entire surface of the emitter region 120 positioned on the front surface of the semiconductor substrate 110 has the uneven portions.

Light incident on the front surface of the semiconductor substrate 110 having the plurality of uneven portions is reflected several times by the uneven portions of the emitter region 120 and the uneven portions of the semiconductor substrate 110 and is incident inside the semiconductor substrate 110. Hence, an amount of light reflected from the front surface of the semiconductor substrate 110 decreases, and an amount of light incident inside the semiconductor substrate 110 increases. Further, surface areas of the semiconductor substrate 110 and the emitter region 120, on which light is incident, increase by the uneven portions, and an amount of light incident on the semiconductor substrate 110 increases.

As shown in FIGS. 17 and 18, the emitter region 120 is formed at the front surface (corresponding to an incident surface) of the semiconductor substrate 110 of the first conductive type and is a region formed by doping the semiconductor substrate 110 with impurities of a second conductive type (for example, n-type) opposite the first conductive type (for example, p-type). Namely, the emitter region 120 may be positioned inside the surface (i.e., the front surface) of the semiconductor substrate 110, on which light is incident. Thus, the emitter region 120 of the second conductive type forms a p-n junction along with a first conductive type region of the semiconductor substrate 110.

Carriers, i.e., electron-hole pairs produced by light incident on the semiconductor substrate 110 are separated into electrons and holes by the p-n junction between the semiconductor substrate 110 and the emitter region 120. Then, the separated electrons move to the n-type semiconductor, and the separated holes move to the p-type semiconductor. Thus, when the semiconductor substrate 110 is of the p-type and the emitter region 120 is of the n-type, the electrons move to the emitter region 120, and the holes move to the semiconductor substrate 110.

Because the emitter region 120 forms the p-n junction along with the semiconductor substrate 110, i.e., the first conductive type region of the semiconductor substrate 110, the emitter region 120 may be of the p-type when the semiconductor substrate 110 is of the n-type unlike the embodiment described above. In this instance, the electrons may move to a back surface of the semiconductor substrate 110, and the holes may move to the emitter region 120.

Returning to the embodiment of the invention, when the emitter region 120 is of the n-type, the emitter region 120 may be formed by doping the semiconductor substrate 110 with impurities of a group V element such as P, As, and Sb. On the contrary, when the emitter region 120 is of the p-type, the emitter region 120 may be formed by doping the semiconductor substrate 110 with impurities of a group III element such as B, Ga, and In.

As shown in FIGS. 17 and 18, the anti-reflection layer 130 is positioned on the front surface of the semiconductor substrate 110. When the emitter region 120 is positioned on the front surface of the semiconductor substrate 110, the anti-reflection layer 130 may be positioned on the emitter region 120.

The anti-reflection layer 130 may include at least one of hydrogenated silicon nitride (SiNx:H), hydrogenated silicon oxide (SiOx:H), hydrogenated silicon nitrogen oxide (SiNxOy:H), and hydrogenated amorphous silicon (a-Si:H).

The anti-reflection layer 130 may perform a passivation function, which converts a defect, for example, dangling bonds existing at and around the surface of the semiconductor substrate 110 into stable bonds using hydrogen (H) contained in the anti-reflection layer 130 and prevents or reduces a recombination and/or a disappearance of carriers moving to the surface of the semiconductor substrate 110. Thus, the anti-reflection layer 130 reduces an amount of carriers lost by the defect at and around the surface of the semiconductor substrate 110.

When the semiconductor substrate 110 has the uneven portions, the anti-reflection layer 130 includes an uneven surface having a plurality of uneven portions similar to the semiconductor substrate 110.

In general, because the defect mainly exists at and around the surface of the semiconductor substrate 110, the passivation function of the anti-reflection layer 130 is further improved when the anti-reflection layer 130 directly contacts the surface of the semiconductor substrate 110 as in the embodiment of the invention.

The anti-reflection layer 130 may include a plurality of layers using at least one of hydrogenated silicon nitride (SiNx:H), hydrogenated silicon oxide (SiOx:H), hydrogenated silicon nitrogen oxide (SiNxOy:H), hydrogenated silicon oxynitride (SiOxNy:H), and hydrogenated amorphous silicon (a-Si:H).

For example, the anti-reflection layer 130 may include two layers using hydrogenated silicon nitride (SiNx:H).

Hence, the passivation function of the anti-reflection layer 130 may be further improved, and photoelectric efficiency of the solar cell may be further improved.

As shown in FIGS. 17 and 18, the plurality of first electrodes 140 are positioned on the front surface of the semiconductor substrate 110 and are separated from one another. Each first electrode 140 may extend in a first direction x.

The electrodes, which are separated from one another on the front surface of the semiconductor substrate 110 and extend in the first direction x, may be referred to as front fingers.

The plurality of first electrodes 140 may pass through the anti-reflection layer 130 and may be connected to the emitter region 120.

The first electrodes 140 may be formed of at least one conductive material, for example, silver (Ag) and may collect carriers (for example, electrons) moving to the emitter region 120.

The solar cell according to the embodiment of the invention may not include a bus bar electrode, which extends in a second direction y crossing the first direction x so that the plurality of first electrodes 140 are commonly connected to the bus bar electrode.

The wiring members IC connecting the plurality of solar cells C1 and C2 are generally connected to the bus bar electrode. However, in the solar cell according to the embodiment of the invention, the wiring member IC may be directly connected to the first electrode 140 instead of the bus bar electrode.

The back surface field regions 172 may be positioned at the back surface opposite the front surface of the semiconductor substrate 110. The back surface field region 172 is a region (for example, a $p^+$-type region) which is more heavily doped than the semiconductor substrate 110 with impurities of the same conductive type as the semiconductor substrate 110.

A potential barrier is formed by a difference between impurity concentrations of the first conductive type region of the semiconductor substrate 110 and the back surface field region 172. Hence, the potential barrier prevents or reduces electrons from moving to the back surface field region 172 used as a moving path of holes and makes it easier for holes to move to the back surface field region 172. Thus, the back surface field region 172 reduces an amount of carriers lost by a recombination and/or a disappearance of electrons and holes at and around the back surface of the semiconductor substrate 110 and accelerates a movement of desired carriers (for example, holes), thereby increasing the movement of carriers to the second electrode 150.

The second electrode 150 may include a back electrode layer 151 and a plurality of back bus bars 152. The back electrode layer 151 contacts the back surface field region 172 positioned at the back surface of the semiconductor substrate 110. The back electrode layer 151 may be substantially positioned on the entire back surface of the semiconductor substrate 110 except an edge of the back surface of the semiconductor substrate 110 and a formation area of the back bus bars 152.

The back electrode layer 151 may contain a conductive material, for example, aluminum (Al).

The back electrode layer 151 collects carriers (for example, holes) moving to the back surface field region 172.

Because the back electrode layer 151 contacts the back surface field region 172 having the impurity concentration higher than the semiconductor substrate 110, a contact resistance between the semiconductor substrate 110 (i.e., the back surface field region 172) and the back electrode layer 151 decreases. Hence, the transfer efficiency of carriers from the semiconductor substrate 110 to the back electrode layer 151 is improved.

The plurality of back bus bars 152 are positioned on the back surface of the semiconductor substrate 110, on which the back electrode layer 151 is not positioned, and are connected to the back electrode layer 151.

The back bus bars 152 may collect carriers transferred from the back electrode layer 151.

The back bus bars 152 are connected to the wiring member IC, and thus carriers (for example, holes) collected by the back bus bars 152 may be transferred to the adjacent other solar cell through the wiring member IC.

The back bus bars 152 may be formed of a material having better conductivity than the back electrode layer 151. For example, the back bus bars 152 may contain at least one conductive material, for example, silver (Ag).

The wiring member IC may be connected to each of the plurality of back bus bars 152.

An operation of the solar cell having the above-described structure is described below.

When light irradiated onto the solar cell is incident on the emitter region 120 and the semiconductor substrate 110 through the anti-reflection layer 130, a plurality of electron-hole pairs are generated in the semiconductor part by light energy produced based on the incident light. In this instance, a reflection loss of the light incident on the semiconductor substrate 110 is reduced by the uneven surface of the semiconductor substrate 110 and the emitter region 120, and an amount of light incident on the semiconductor substrate 110 increases.

The electron-hole pairs are separated into electrons and holes due to the p-n junction of the semiconductor substrate 110 and the emitter region 120. The electrons move to the n-type emitter region 120, and the holes move to the p-type semiconductor substrate 110. The electrons moving to the emitter region 120 are collected by the first electrodes 140 and are transferred to the wiring members IC. The holes moving to the semiconductor substrate 110 are collected by the back electrode layer 151 and the back bus bars 152 and are transferred to the wiring members IC.

So far, the embodiment of the invention shown in FIGS. 17 and 18 described the solar cell having a conventional structure, in which the first electrodes 140 are positioned on the front surface of the semiconductor substrate 110 and the second electrode 150 is positioned on the back surface of the semiconductor substrate 110, as an example. However, the embodiment of the invention may be applied to a solar cell, in which the first electrodes 140 and the second electrode 150 are positioned on the back surface of the semiconductor substrate 110.

FIGS. 17 and 18 show the solar cell, in which the back bus bars 152 are positioned on the back surface of the semiconductor substrate 110, as an example. However, the back bus bars 152 may be omitted. Namely, the second electrode 150 may include only the back electrode layer 151.

The solar cell according to the embodiment of the invention may have structures other than FIGS. 17 and 18. The various structures of the solar cell will be described after the number and the width of wiring members IC applied to the solar cell module according to the embodiment of the invention are described. The various structures of the solar cell will be described later with reference to FIGS. 29 to 31.

In the following description, the embodiment of the invention is described using the solar cell shown in FIGS. 17 and 18 as an example for the sake of brevity and ease of reading.

As shown in (a) of FIG. 16, in the solar cell module according to the embodiment of the invention, a longitudinal direction of the first electrodes 140 of each of the plurality of solar cells C1 and C2 may be the first direction x, and the plurality of solar cells C1 and C2 may be arranged in the second direction y crossing the first direction x.

As shown in (a) to (c) of FIG. 16, the plurality of wiring members IC may be connected to the first electrodes 140 or the second electrode 150, so as to electrically connect the solar cells C1 and C2 in series.

More specifically, as shown in (b) of FIG. 16, in the solar cell module according to the embodiment of the invention, the plurality of wiring members IC may extend in the second direction y and may connect the first electrodes 140 of the first solar cell C1 to the second electrode 150 of the second solar cell C2 in series.

Each wiring member IC may have a wire shape. In this instance, as shown in (a) of FIG. 16, a cross section of each wiring member IC may have a curved surface. Namely, (a) of FIG. 16 shows that the cross section of each wiring member IC has a circle, as an example. However, the cross section of each wiring member IC may have one of an oval, a semicircle, a rectangle, and a trapezoid.

Hence, light incident from the outside is reflected by an inclined surface of the wiring member IC and is incident on the semiconductor substrate 110. Alternatively, the light incident from the outside is again reflected from a transparent substrate positioned on the front surfaces of the solar cells C1 and C2 and is incident on the semiconductor substrate 110. As a result, an amount of light incident on the solar cell may increase.

The plurality of wiring members IC may use a solder paste containing a metal material, for example, tin (Sn) in the first electrode 140 or the second electrode 150 of the solar cell, a conductive paste, in which conductive metal particles are included in an insulating resin, or a conductive material such as conductive adhesive film.

In the above-described solar cell module, the number NIC of wiring members IC and a width WIC of each wiring member IC may be set to a predetermined value.

Namely, in each of the plurality of solar cells C1 and C2 of the solar cell module according to the embodiment of the invention, the number NIC of wiring members IC connected to the first electrodes 140 or the second electrode 150 may be 10 to 18 in consideration of resistances of the wiring members IC, a shading area covered by the wiring members IC, and an output of the solar cell. Further, the width WIC of each wiring member IC may be 0.24 mm to 0.53 mm.

A reason why the number NIC of wiring members IC in the solar cell module according to the embodiment of the invention is set as described above is as follows.

Figure 19:
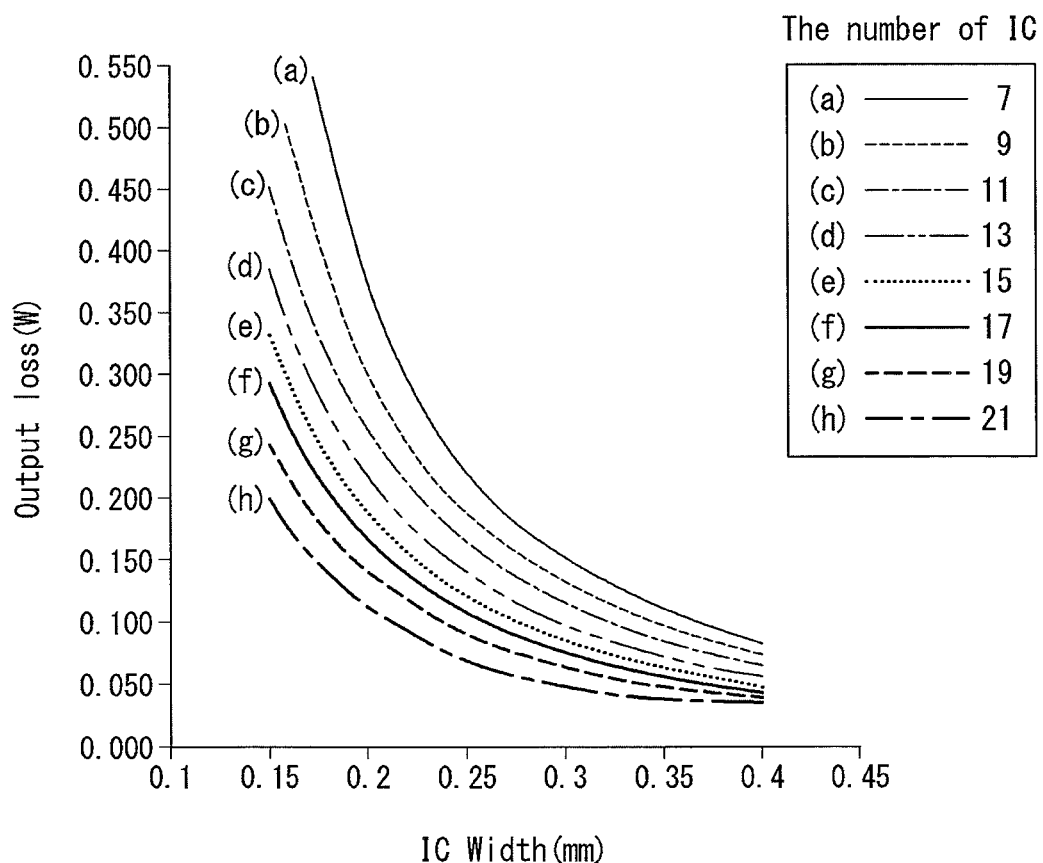
FIG. 19 is a graph indicating an output reduction amount of a solar cell module depending on a resistance of a wiring member shown in FIG. 16.
Figure 20:
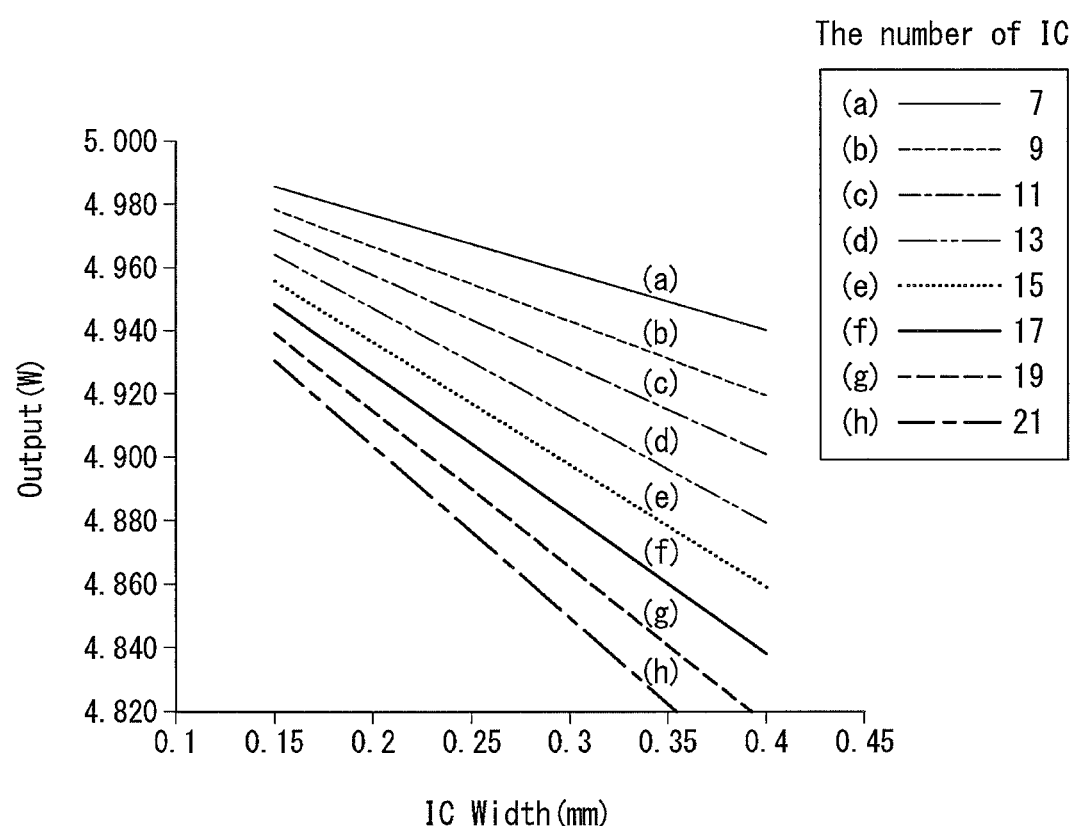
FIG. 20 is a simulation graph indicating an output of a solar cell module in a remaining area except a shading area covered by a wiring member shown in FIG. 16.

Output values of the solar cell module indicated by the graphs of FIGS. 19 and 20 are given as an example, and the embodiment of the invention is not limited thereto. Thus, the output values may vary depending on other conditions including the configuration of the solar cell, the number of solar cells applied to the solar cell module, etc.

FIG. 19 is a graph indicating an output reduction amount of the solar cell module depending on a resistance of the wiring member IC shown in FIG. 16.

More specifically, FIG. 19 shows a simulation result of a relationship between a resistance of the wiring member IC and an output reduction amount of the solar cell module without considering a shading area of the semiconductor substrate 110 covered by the wiring members IC.

Referring to FIG. 19, as the number NIC and the width WIC of the wiring members IC increase, the output reduction amount of the solar cell module decreases.

More specifically, as the number NIC and the width WIC of the wiring member IC decrease, the resistance of the wiring member IC increases. Hence, the output reduction amount of the solar cell module increases. Namely, as the number NIC and the width WIC of the wiring members IC increase, the resistance of the wiring member IC is improved. Hence, the output reduction amount of the solar cell module decreases.

Although the number NIC and the width WIC of the wiring members IC increase to value equal to or greater than a predetermined value, the output reduction amount of the solar cell module converges to about 0.05 W.

Accordingly, as the number NIC and the width WIC of the wiring members IC increase, the output amount of the solar cell module increases because the resistance of the wiring member IC decreases. Further, after the number NIC and the width WIC of the wiring members IC increase to value equal to or greater than a predetermined value, the output amount of the solar cell module slowly increases.

In other words, as the number NIC and the width WIC of the wiring members IC increase, the resistance of the wiring member IC decreases. When the resistance of the wiring member IC decreases to a value equal to or less than a predetermined value, the output amount of the solar cell module increases to a maximum value each solar cell can output.

In this instance, when the width WIC of the wiring member IC is relatively small (for example, when the width WIC is 0.15 mm), there is a relatively large difference between the output reduction amounts of the solar cell module depending on changes in the number NIC of wiring members IC. Further, when the width WIC of the wiring member IC is relatively large (for example, when the width WIC is 0.4 mm), there is a relatively small difference between the output reduction amounts of the solar cell module depending on changes in the number NIC of wiring members IC.

FIG. 20 is a simulation graph indicating an output of the solar cell module in a remaining area except a shading area covered by the wiring member shown in FIG. 16.

In the graph shown in FIG. 20, an influence of the resistance of the wiring member IC was excluded.

FIG. 20 shows a simulation result of an output value of the solar cell obtained by adjusting the number NIC and the width WIC of the wiring members IC applied to the solar cell module in a state where a maximum output of each solar cell included in the solar cell module when there is no wiring member IC is set to 5 W, for example.

As shown in FIG. 20, as the number NIC and the width WIC of the wiring members IC increase, a shading area covered by the wiring members IC increases. Hence, an output of the solar cell decreases.

In this instance, when the width WIC of the wiring members IC decreases, there is a relatively small change in the output of the solar cell irrespective of the number NIC of wiring members IC. Further, when the width WIC of the wiring members IC increases, there is a relatively large change in the output of the solar cell depending on the number NIC of wiring members IC.

Namely, as the number NIC of wiring members IC increases, an influence of the number NIC on the width WIC of the wiring members IC relatively increases. Hence, the output of the solar cell greatly decreases.

Thus, when the width WIC of the wiring member IC is 0.15 mm, the shading area covered by the wiring members IC slightly increases even when the number NIC of wiring members IC changes from 7 to 21. Therefore, the output of the solar cell slightly decreases.

However, when the width WIC of the wiring member IC is 0.4 mm, the shading area covered by the wiring members IC greatly increases when the number NIC of wiring members IC changes from 7 to 21. Therefore, the output of the solar cell greatly decreases.

As can be seen from the simulation results of FIGS. 19 and 20, when the number NIC and the width WIC of the wiring members IC increase, the resistance of the wiring members IC decreases. However, because the shading area covered by the wiring members IC relatively increases, the output of the solar cell is affected. Further, when the number NIC and the width WIC of the wiring members IC decrease, the resistance of the wiring members IC increases. However, because the shading area covered by the wiring members IC relatively decreases, the output of the solar cell is affected.

Accordingly, the output of each solar cell applied to the solar cell module can be further maximized by properly adjusting the number NIC and the width WIC of the wiring members IC.

Further, the embodiment of the invention set the width WIC of the wiring members IC to a predetermined value and then simulated the output of the solar cell module depending on the number NIC of wiring members IC at the set width WIC of the wiring members IC, so as to find the proper number NIC of wiring members IC.

Figure 21:
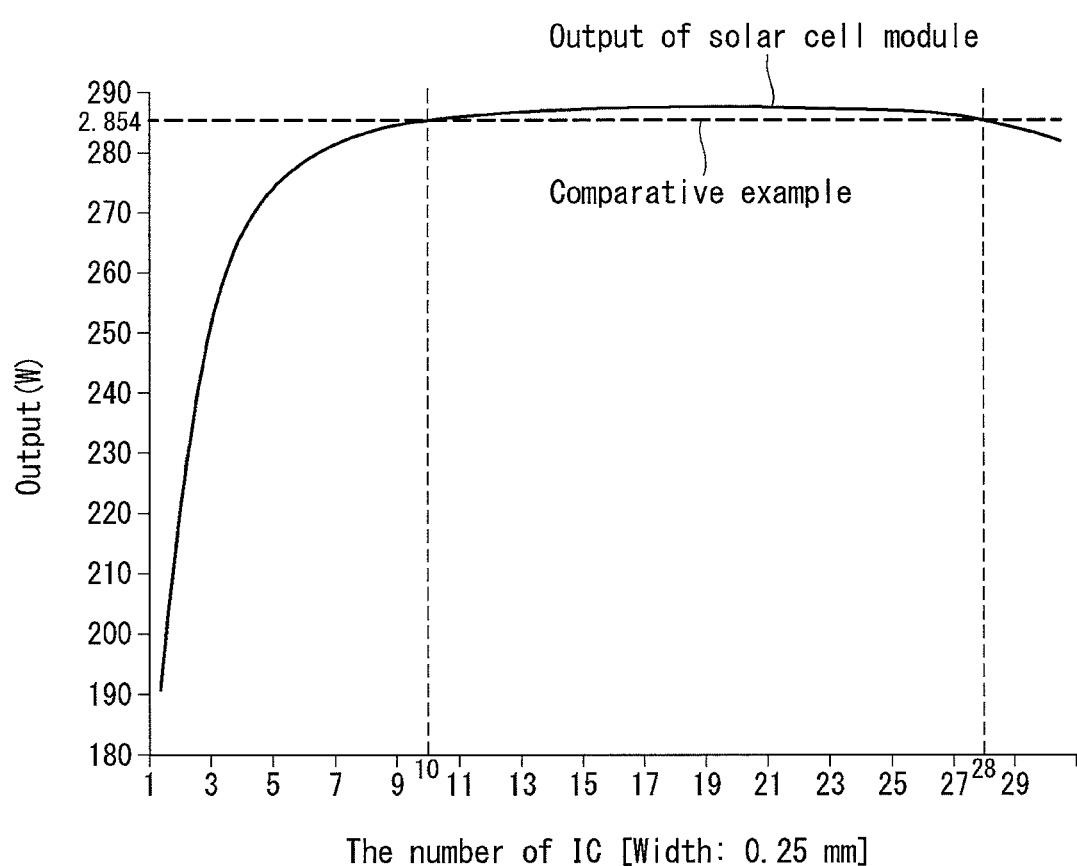
FIG. 21 shows a simulation result of an output of a solar cell module depending on the number of wiring members when a width of the wiring member is 0.25 mm.
Figure 22:
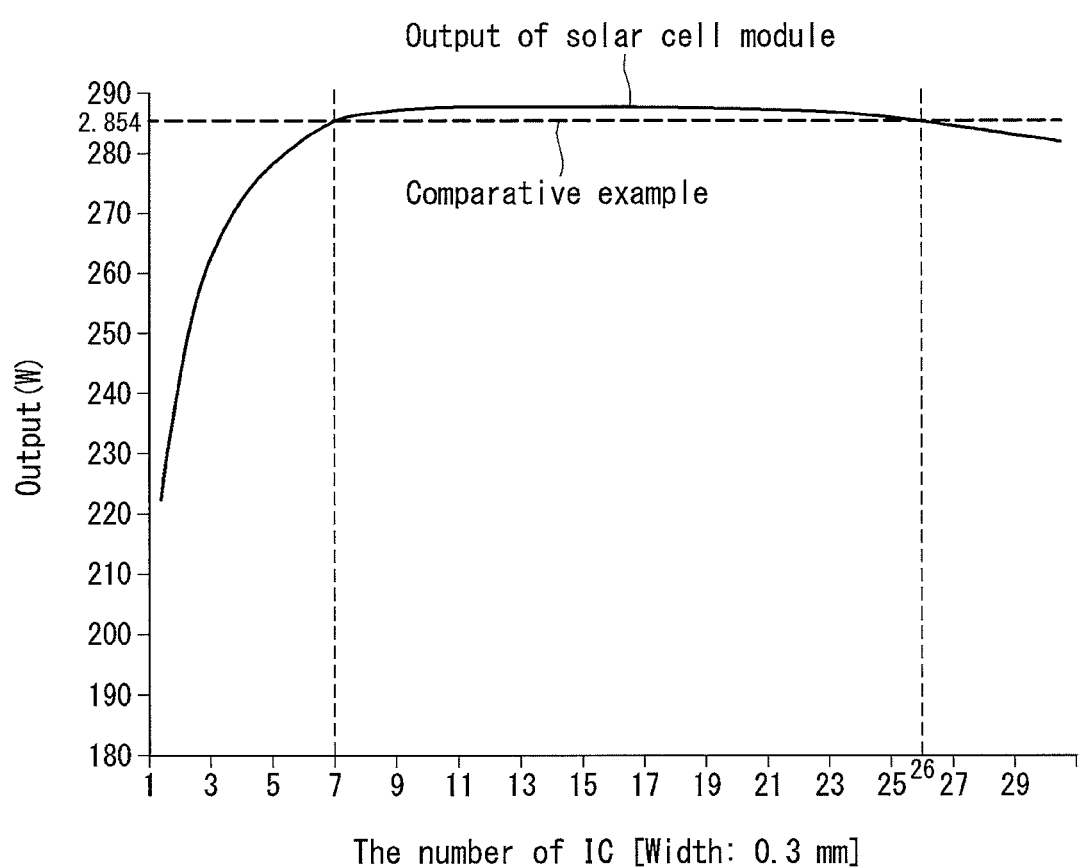
FIG. 22 shows a simulation result of an output of a solar cell module depending on the number of wiring members when a width of the wiring member is 0.3 mm.
Figure 23:
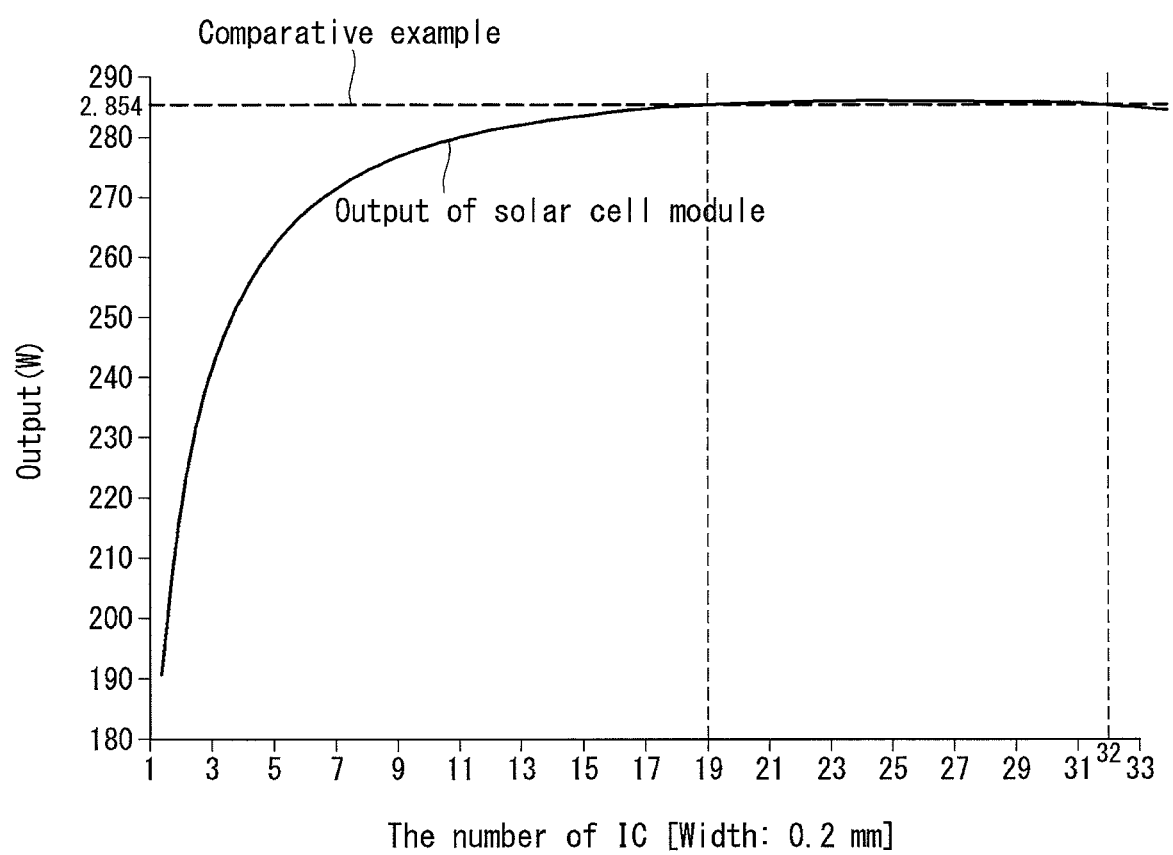
FIG. 23 shows a simulation result of an output of a solar cell module depending on the number of wiring members when a width of the wiring member is 0.2 mm.

FIG. 21 shows a simulation result of an output of the solar cell module depending on the number NIC of wiring members IC when the width WIC of the wiring member IC is 0.25 mm. FIG. 22 shows a simulation result of an output of the solar cell module depending on the number NIC of wiring members IC when the width WIC of the wiring member IC is 0.3 mm. FIG. 23 shows a simulation result of an output of the solar cell module depending on the number NIC of wiring members IC when the width WIC of the wiring member IC is 0.2 mm.

Output values of the solar cell module indicated by the graphs of FIGS. 21 to 23 are given as an example, and the embodiment of the invention is not limited thereto. Thus, the output values may vary depending on other conditions including the configuration of the solar cell, the number of solar cells applied to the solar cell module, etc.

In FIGS. 21 to 23, for example, an allowable maximum output of each solar cell was 5 W, and the number of solar cells applied to one solar cell module was 60. Thus, a maximum output of one solar cell module was 300 W.

In FIGS. 21 to 23, a comparative example shows a simulation result of the output of the solar cell module when the number NIC of wiring members IC was 3 and the width WIC of the wiring member IC was 1.5 mm. In this instance, an output of the solar cell module in the comparative example was 285.4 W.

FIGS. 21 to 23 show a simulation result of the output of the solar cell module depending on the number NIC of wiring members IC in consideration of the resistance of the wiring members IC and the shading area.

As shown in FIG. 21, when the width WIC of the wiring member IC was 0.25 mm, the output of the solar cell module according to the embodiment of the invention was less than the comparative example when the number NIC of wiring members IC was 1 to 9, was greater than the comparative example when the number NIC of wiring members IC was 10 to 28, and was less than the comparative example when the number NIC of wiring members IC exceeded 29. Thus, the solar cell module according to the embodiment of the invention had the maximum output when the number NIC of wiring members IC was 17. In this instance, the maximum output of the solar cell module according to the embodiment of the invention was 287.5 W greater than the comparative example by about 2 W.

Further, as shown in FIG. 22, when the width WIC of the wiring member IC was 0.3 mm, the output of the solar cell module according to the embodiment of the invention was less than the comparative example when the number NIC of wiring members IC was greater than 1 and less than 7, was greater than the comparative example when the number NIC of wiring members IC was 7 to 26, and was less than the comparative example when the number NIC of wiring members IC exceeded 27. Thus, the solar cell module according to the embodiment of the invention had the maximum output when the number NIC of wiring members IC was 13. In this instance, the maximum output of the solar cell module according to the embodiment of the invention was 288.6 W greater than the comparative example by about 3.2 W.

Further, as shown in FIG. 23, when the width WIC of the wiring member IC was 0.2 mm, the output of the solar cell module according to the embodiment of the invention was less than the comparative example when the number NIC of wiring members IC was greater than 1 and less than 19, was greater than the comparative example when the number NIC of wiring members IC was 19 to 32, and was less than the comparative example when the number NIC of wiring members IC exceeded 32. Thus, the solar cell module according to the embodiment of the invention had the maximum output when the number NIC of wiring members IC was 24. In this instance, the maximum output of the solar cell module according to the embodiment of the invention was 286.03 W greater than the comparative example by about 0.63 W.

According to the simulation results of FIGS. 21 to 23, when the width WIC of the wiring member IC was 0.2 mm, a difference between the maximum output values of the embodiment of the invention and the comparative example was less than 1 W. Thus, because the difference was not the meaningful value, the simulation result of FIG. 23 was excluded from the basis for setting the number NIC of wiring members IC in the embodiment of the invention. Only the simulation results of FIGS. 21 and 22 were used.

According to the simulation results of FIGS. 21 and 22, when the number NIC of wiring members IC was 10 to 26, the maximum output of the solar cell module according to the embodiment of the invention was always greater than the comparative example.

The embodiment of the invention simulates the material cost of the wiring member and a shadow area compared to a comparative example within the range obtained from the simulation results of FIGS. 21 to 23.

Figure 24:
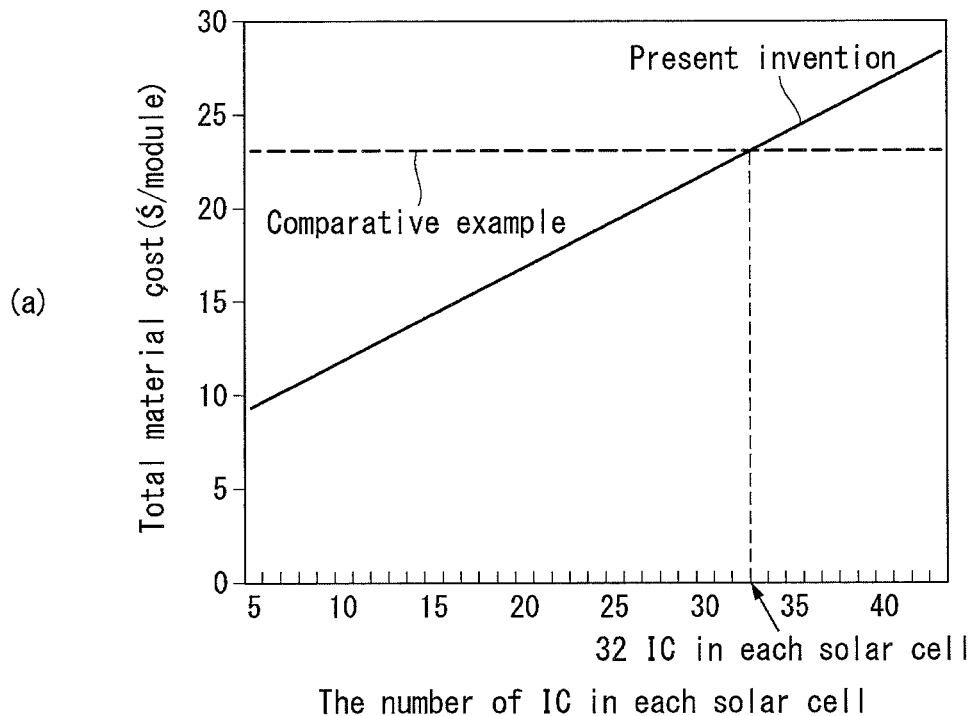
FIG. 24 is a graph showing a comparison between an embodiment of the invention and a comparative example in terms of the material cost of a wiring member and a shadow area.
Figure 24:
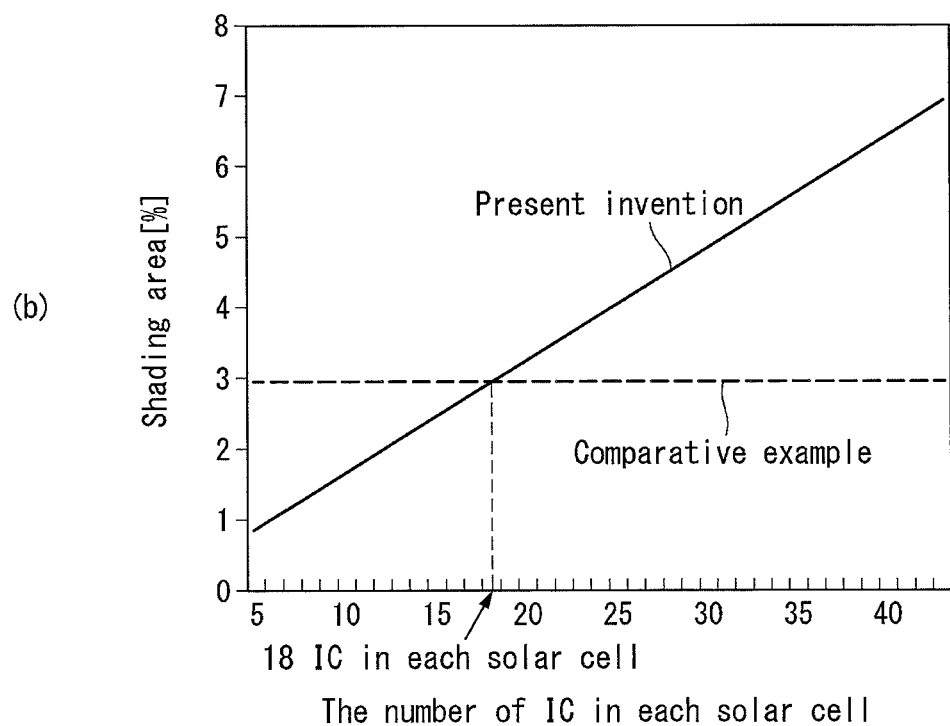

FIG. 24 is a graph showing a comparison between the embodiment of the invention and a comparative example in terms of the material cost of the wiring member and a shadow area.

In FIG. 24, in the comparative example, the number NIC of wiring members IC was 3, and the width WIC of the wiring member IC was 1.5 mm. In the embodiment of the invention, the width WIC of the wiring member IC was 0.25 mm.

As shown in (a) of FIG. 24, the number NIC of wiring members IC in each solar cell was 32, the material cost of the wiring member in the embodiment of the invention was the same as the comparative example.

Thus, the number NIC of wiring members IC in each solar cell was equal to or less than 32, the material cost of the wiring member in the embodiment of the invention was less than the comparative example.

As shown in (b) of FIG. 24, when the width WIC of the wiring member IC was 0.25 mm and the number NIC of wiring members IC in each solar cell was 18, the embodiment of the invention had the same shadow area as the comparative example. When the number NIC of wiring members IC in each solar cell exceeded 18, the embodiment of the invention had the shadow area greater than the comparative example.

According to the simulation results of FIGS. 21 to 23 and the graph of FIG. 24, when the number NIC of wiring members IC in each solar cell was less than 18, the material cost of the wiring member was further reduced, and the shadow area was less than the comparative example.

Accordingly, setting the number NIC of wiring members IC to 10 to 18 may further reduce the material cost of the wiring member in consideration of the number NIC (=10 to 26) of wiring members IC obtained from the simulation results of FIGS. 21 and 22 and the graph of FIG. 24.

As a result, the number NIC of wiring members IC in the solar cell module according to the embodiment of the invention was set to 10 to 18 in consideration of FIGS. 21 to 24.

The embodiment of the invention simulates the width WIC of the wiring member IC in a state the number NIC of wiring members IC is determined, and sets the width WIC of the wiring member IC, which makes it possible to have the optimum output.

FIGS. 25 to 28 are graphs showing simulation results of the output value of the solar cell module depending on the width WIC of the wiring member IC when the number NIC of wiring members IC are 11, 13, 15, and 17.

Figure 25:
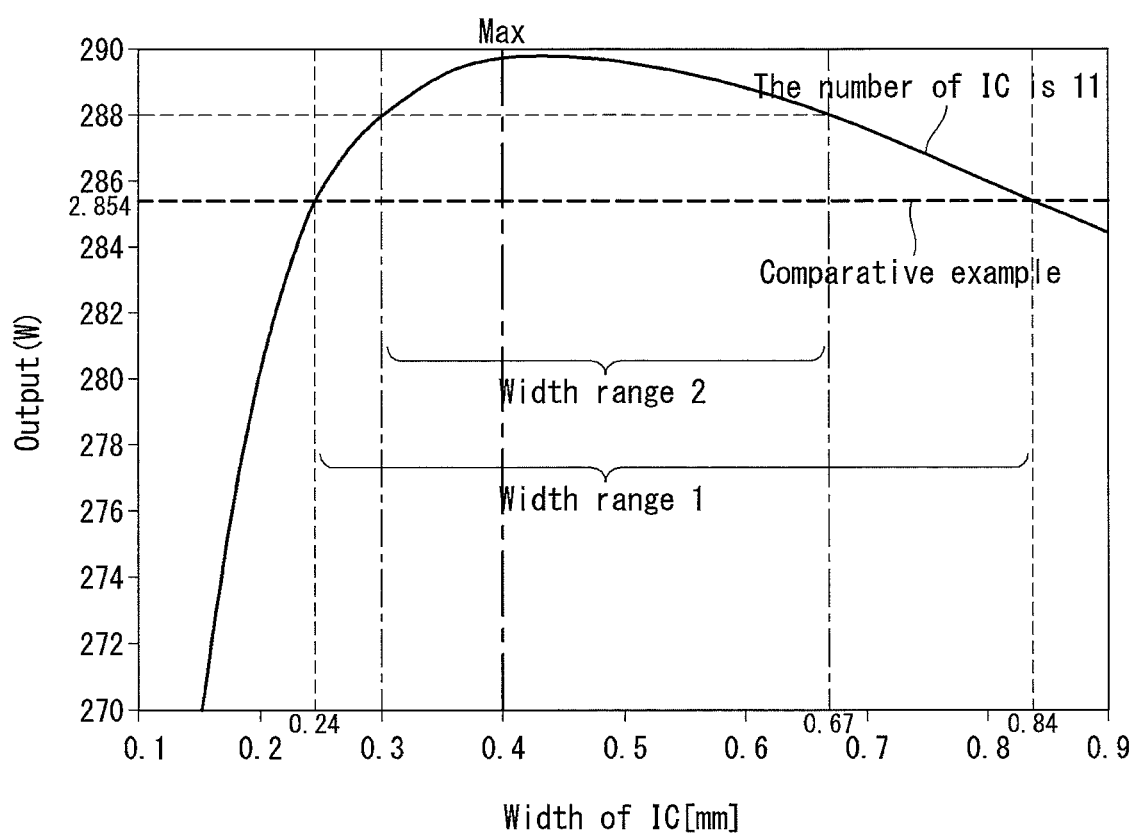
FIG. 25 is a graph showing a simulation result of an output value of a solar cell module depending on a width of a wiring member when the number of wiring members is 11.
Figure 26:
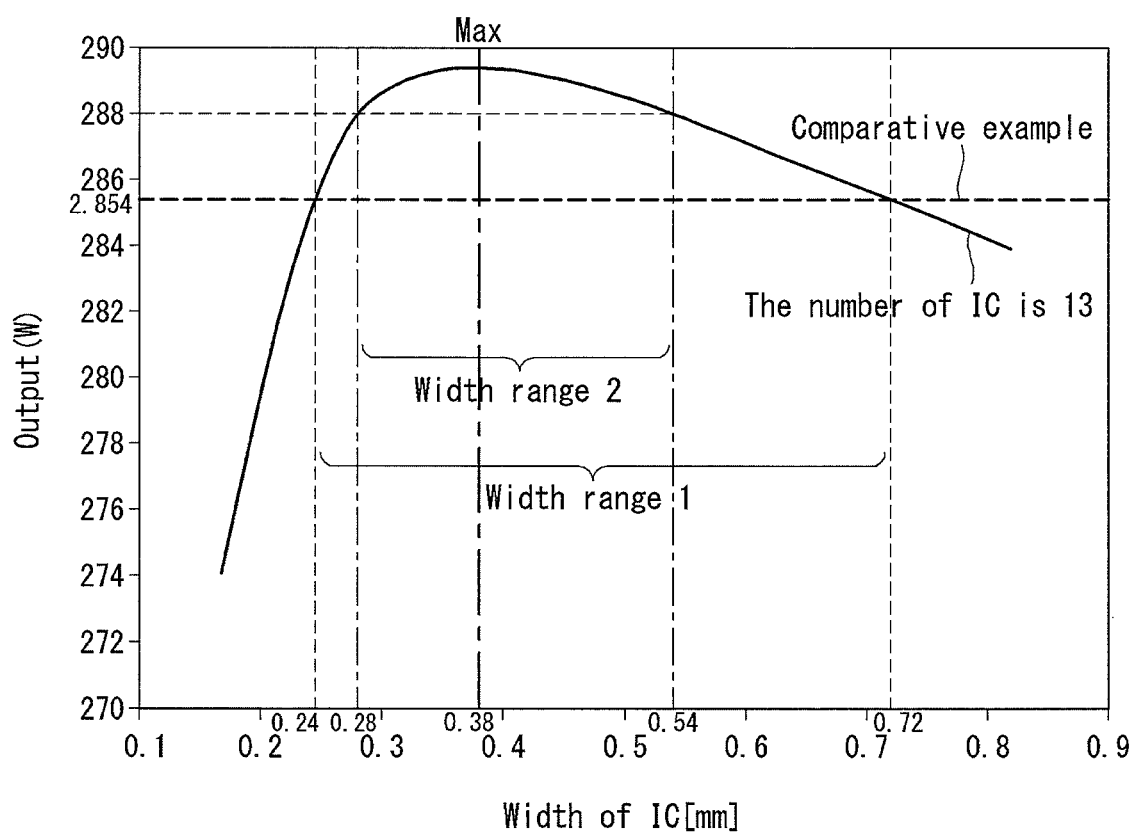
FIG. 26 is a graph showing a simulation result of an output value of a solar cell module depending on a width of a wiring member when the number of wiring members is 13.
Figure 27:
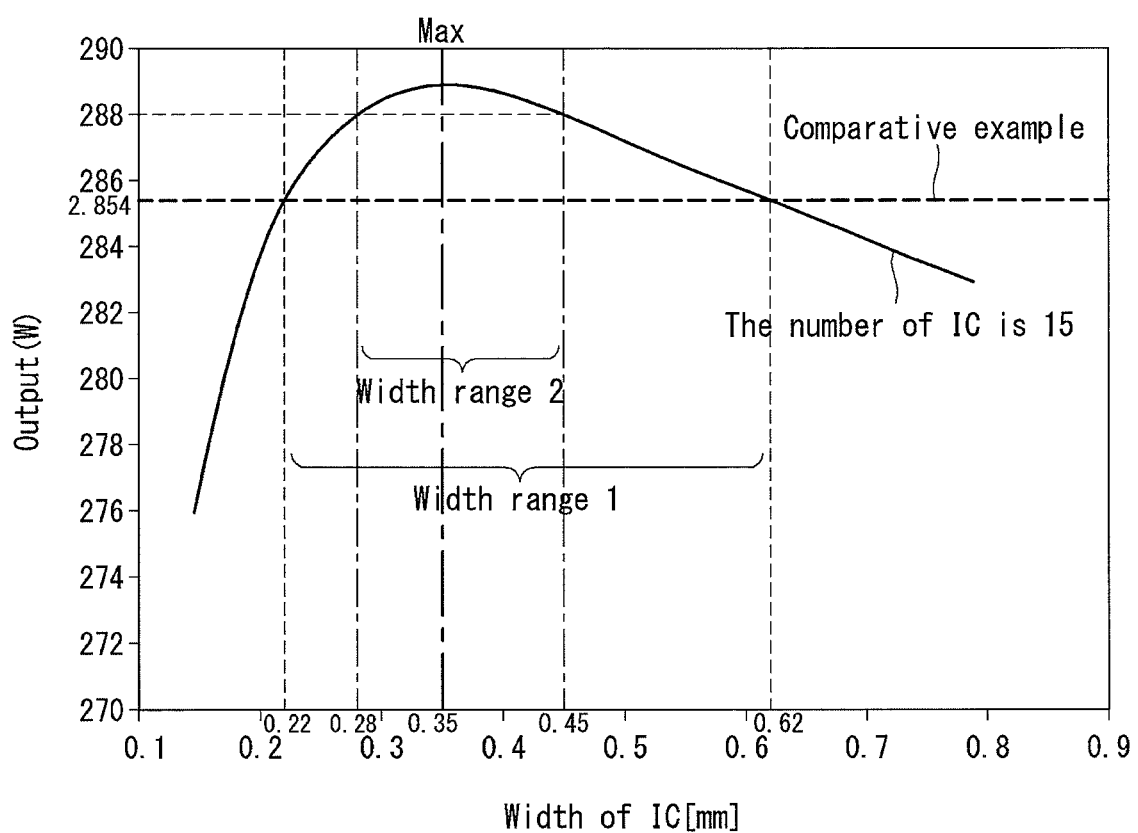
FIG. 27 is a graph showing a simulation result of an output value of a solar cell module depending on a width of a wiring member when the number of wiring members is 15.
Figure 28:
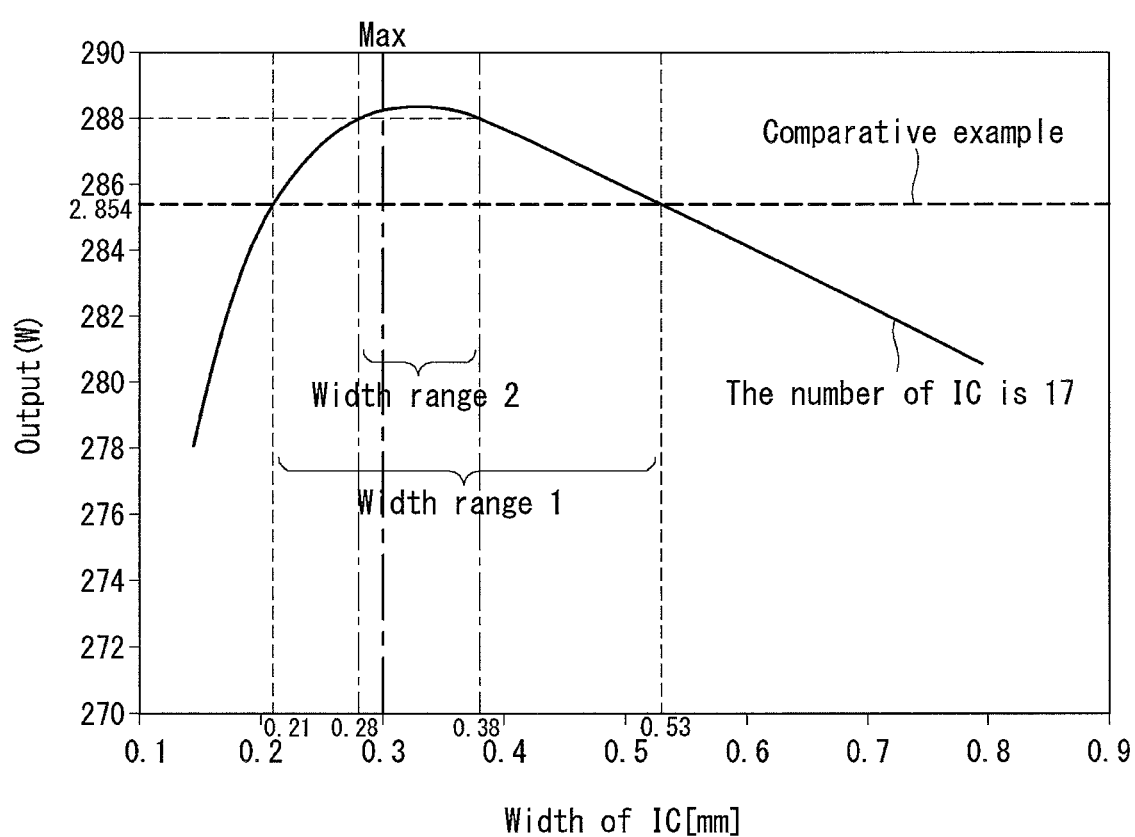
FIG. 28 is a graph showing a simulation result of an output value of a solar cell module depending on a width of a wiring member when the number of wiring members is 17.

More specifically, FIG. 25 is a graph showing a simulation result of the output value of the solar cell module depending on the width WIC of the wiring member IC when the number NIC of wiring members IC is 11. FIG. 26 is a graph showing a simulation result of the output value of the solar cell module depending on the width WIC of the wiring member IC when the number NIC of wiring members IC is 13. FIG. 27 is a graph showing a simulation result of the output value of the solar cell module depending on the width WIC of the wiring member IC when the number NIC of wiring members IC is 15. FIG. 28 is a graph showing a simulation result of the output value of the solar cell module depending on the width WIC of the wiring member IC when the number NIC of wiring members IC is 17.

Output values of the solar cell module indicated by the graphs of FIGS. 25 to 28 are given as an example, and the embodiment of the invention is not limited thereto. Thus, the output values may vary depending on other conditions including the configuration of the solar cell, the number of solar cells applied to the solar cell module, etc.

In FIGS. 25 to 28, for example, an allowable maximum output of each solar cell was 5 W, and the number of solar cells applied to one solar cell module was 60. Thus, a maximum output of one solar cell module was 300 W.

In FIGS. 25 to 28, a comparative example shows a simulation result of the output of the solar cell module when the number NIC of wiring members IC was 3 and the width WIC of the wiring member IC was 1.5 mm. In this instance, an output of the solar cell module in the comparative example was 285.4 W.

As shown in FIG. 25, when the number NIC of wiring members IC was 11 and the width WIC of the wiring member IC was 0.24 mm to 0.85 mm, the output of the solar cell module according to the embodiment of the invention was greater than the comparative example. Further, when the width WIC of the wiring member IC was 0.3 mm to 0.67 mm, the output of the solar cell module according to the embodiment of the invention showed good values equal to or greater than 288 W.

In this instance, when the width WIC of the wiring member IC was 0.4 mm, the solar cell module according to the embodiment of the invention obtained the maximum output of 289.4 W, and the maximum output of 289.4 W was greater than the comparative example by about 4 W.

As shown in FIG. 26, when the number NIC of wiring members IC was 13 and the width WIC of the wiring member IC was 0.24 mm to 0.72 mm, the output of the solar cell module according to the embodiment of the invention was greater than the comparative example. Further, when the width WIC of the wiring member IC was 0.28 mm to 0.54 mm, the output of the solar cell module according to the embodiment of the invention showed good values equal to or greater than 288 W.

In this instance, when the width WIC of the wiring member IC was 0.38 mm, the solar cell module according to the embodiment of the invention obtained the maximum output of 289.3 W, and the maximum output of 289.3 W was greater than the comparative example by about 3.9 W.

As shown in FIG. 27, when the number NIC of wiring members IC was 15 and the width WIC of the wiring member IC was 0.22 mm to 0.62 mm, the output of the solar cell module according to the embodiment of the invention was greater than the comparative example. Further, when the width WIC of the wiring member IC was 0.28 mm to 0.45 mm, the output of the solar cell module according to the embodiment of the invention showed good values equal to or greater than 288 W.

In this instance, when the width WIC of the wiring member IC was 0.35 mm, the solar cell module according to the embodiment of the invention obtained the maximum output of 288.7 W, and the maximum output of 288.7 W was greater than the comparative example by about 3.3 W.

As shown in FIG. 28, when the number NIC of wiring members IC was 17 and the width WIC of the wiring member IC was 0.21 mm to 0.53 mm, the output of the solar cell module according to the embodiment of the invention was greater than the comparative example. Further, when the width WIC of the wiring member IC was 0.28 mm to 0.38 mm, the output of the solar cell module according to the embodiment of the invention showed good values equal to or greater than 288 W.

In this instance, when the width WIC of the wiring member IC was 0.3 mm, the solar cell module according to the embodiment of the invention obtained the maximum output of 288.7 W, and the maximum output of 288.7 W was greater than the comparative example by about 3.3 W.

According to the simulation results of FIGS. 25 to 28, when the number NIC of wiring members IC was 10 to 18 and the width WIC of the wiring member IC was 0.24 mm to 0.53 mm, the output of the solar cell module according to the embodiment of the invention was greater than the comparative example.

Further, when the number NIC of wiring members IC is 10 to 18, the width WIC of the wiring member IC may be 0.3 mm to 0.38 mm in the embodiment of the invention. In this instance, the output of the solar cell module according to the embodiment of the invention is greater than the comparative example as shown in FIGS. 25 to 28.

The present inventor compared an amount of electricity generated by the solar cell while changing the width and the number of the wiring members with a comparative example, so as to find a relationship between the number of wiring members and the width of the wiring member. A result of the comparison is shown in FIG. 29. In the embodiment disclosed herein, the comparative example is a solar cell having a so-called 3-bus bar structure and implements a connection structure of the solar cell using three buses and three ribbons.

The present inventor simulated an output of the solar cell while changing the number of wiring members into 6, 8, 10, 12, 14, 16, 18, 20, 22, 24, 26, 28, and 30 at each width of the wiring member when the width of the wiring member was 250 µm, 300 µm, 340 µm, 360 µm, 400 µm, and 500 µm, and compared a result of simulation with the comparative example.

In FIG. 29, "power" (indicating the output) is a value obtained by subtracting the simulation result from an output value of the comparative example. Thus, a minus power value indicates that the simulation result is worse than the comparative example, and a plus power value indicates that the simulation result is better than the comparative example. Therefore, the number of wiring members obtained when the simulation result changes from the minus power value to the plus power value corresponds to a minimum value of the number of wiring members.

As indicated by a table of FIG. 29, when the width of the wiring member was 250 the minimum value of the number of wiring members was 15. Further, when the width of the wiring member was 300 µm, 340 µm/360 µm, 400 µm, and 500 µm, the minimum value of the number of wiring members was 11, 9, 7, and 6, respectively.

On the contrary, the number of wiring members obtained when an increasing value of the simulation result decreases corresponds to a maximum value of the number of wiring members. When the width of the wiring member was 500 µm, 400 µm, 360 µm, 340 µm, and 300 µm, the maximum value of the number of wiring members was 17, 21, 23, 24, and 28, respectively. Further, when the width of the wiring member was 250 µm, the maximum value of the number of wiring members was 33 and was beyond the range of the simulation.

Figures 30, 31:
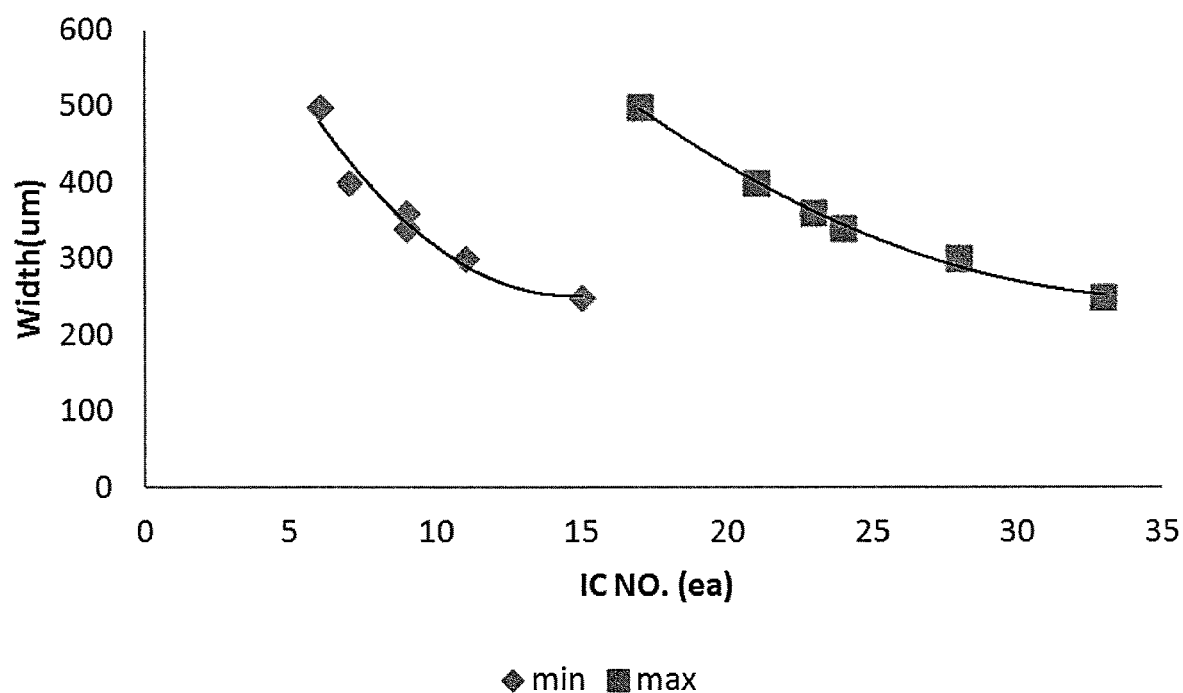
FIG. 30 is a table showing a result of FIG. 29.
FIG. 31 is a graph showing a result of FIG. 29.

FIG. 30 is a table showing the result of FIG. 29, and FIG. 31 is a graph showing the result of FIG. 29.

The minimum value of the number of wiring members is expressed by the following Function 1, and the maximum value of the number of wiring members is expressed by the following Function 2. In this instance, a margin of error is ±5%.

$$x = 3.1101 \times y2 - 90.552 \times y + 911.2,$$ [Function 1]

$$x = 0.7225 \times y2 - 51.38 \times y + 1162.1,$$ [Function 2]

In the above Functions 1 and 2, x is the width of the wiring member, and y is the number of wiring members.

According to the above result, when the solar cell module is configured so that the number of wiring members each having the thin width is 6 to 30 and satisfies the above Functions 1 and 2, the efficiency of the solar cell module can efficiently increase.

Considering the results of FIGS. 19 to 28, when the number of wiring members is 10 to 18 and satisfies the above Functions 1 and 2, the efficiency of the solar cell module can more efficiently increase.

It is preferable that the width of wiring member is 340 µm to 360 µm considering the material cost, a process margin, etc. Thus, as shown in FIG. 30, it is preferable that the number of wiring members is 9 to 24.

Figure 32:
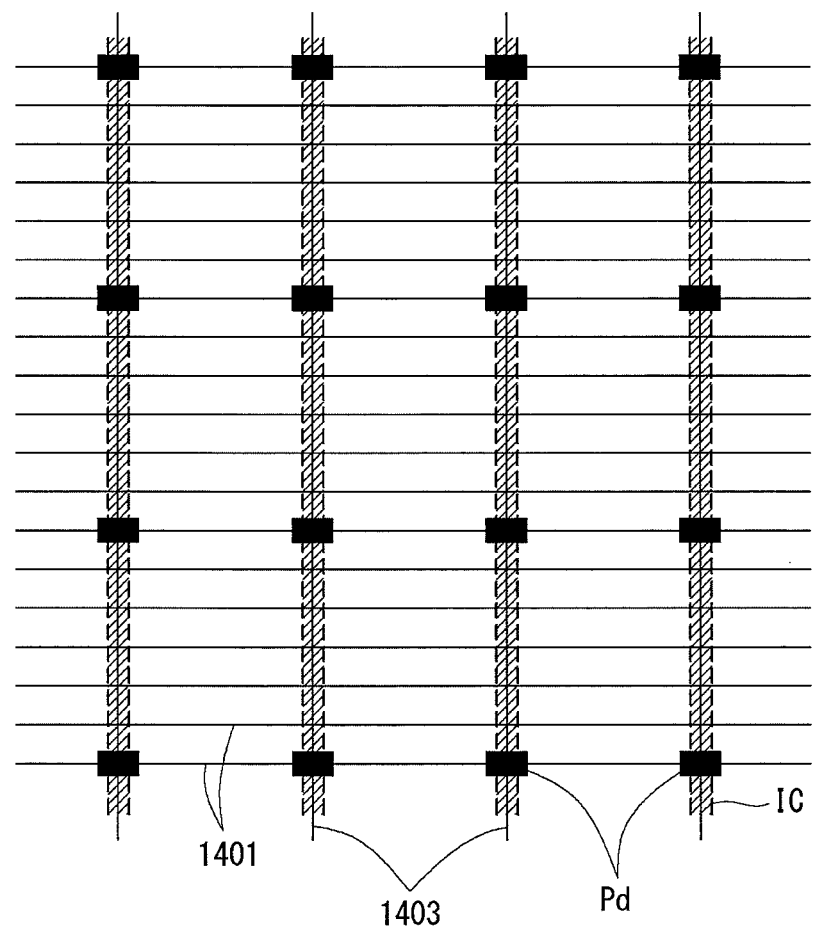
FIG. 32 schematically shows an electrode and a wiring member as another example of a solar cell.

FIG. 32 shows another example of the solar cell. The solar cell of FIG. 32 has a conventional structure, in which a first electrode 140 and a second electrode 150 are respectively positioned on a front surface and a back surface of a semiconductor substrate 110, in the same manner as the solar cell of FIG. 16. FIG. 32 schematically shows only the plane of the electrode.

As shown in FIG. 32, the first electrode 140 includes front fingers 1401, which extend in one direction in parallel with one another, and connection electrodes 1403, which connect the front fingers 1401 in a direction crossing the front fingers 1401.

A wiring member IC is positioned on the connection electrode 1403 and is electrically connected to the connection electrode 1403. Thus, the number of connection electrodes 1403 may be the same as the number of wiring members IC.

The connection electrode 1403 connects the front fingers 1401 and is connected to the wiring member IC. Therefore, it is preferable that a width of the connection electrode 1403 is equal to or greater than a width of the front finger 1401 and is equal to or less than a width of the wiring member IC. As the width of the connection electrode increases, the manufacturing cost of the solar cell increases. Thus, it is preferable that the width of the connection electrode 1403 is set as described above in consideration of a performance and the manufacturing cost of the solar cell.

A pad Pd may be selectively formed at crossings of the front fingers 1401 and the connection electrodes 1403. The pad Pd may increase an area of the crossing and may strongly attach the wiring member IC to the crossing. The pad Pd may be formed at all of the crossings of the front fingers 1401 and the connection electrodes 1403. However, it is preferable that the pad Pd is selectively formed because the connection electrodes 1403 are connected to the wiring member IC. For example, FIG. 32 shows that the pad Pd is formed every six lines. However, the embodiment of the invention is not limited thereto. A position and the number of the pads Pd may be determined in consideration of various variables including the output of the solar cell, an adhesive strength of the wiring member, etc.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
    a plurality of solar cells; and
    a plurality of wiring members configured to electrically connect adjacent solar cells among the plurality of solar cells, each of the plurality of wiring members extending in a straight line in a first direction, wherein a number of the plurality of wiring members is greater than or equal to 6 and less than or equal to 21,
    wherein each solar cell of the plurality of solar cells comprises a first electrode that is disposed on a first side of the solar cell, wherein the first electrode comprises (i) a plurality of finger electrodes that each extend in a straight line in a second direction transverse to the first direction, (ii) a plurality of connection electrodes configured to interconnect the plurality of finger electrodes in the first direction, and (iii) a plurality of contact pads disposed along each of the plurality of connection electrodes, and
    wherein each of the plurality of wiring members has a width that is (i) greater than a width of each of the plurality of connection electrodes such that each wiring member covers each connection electrode, (ii) less than a width of each of the plurality of contact pads such that each wiring member does not fully cover each of the plurality of contact pads, and (iii) greater than or equal to 252.7 μm and less than or equal to 530 μm.

2. The solar cell module of claim 1, wherein a cross-section of each of the plurality of wiring members has a circular or a rounded shape.

3. The solar cell module of claim 1, wherein each solar cell of the plurality of solar cells further comprises a second electrode disposed on a second side, opposite the first side, of the solar cell, and wherein, for each of the plurality of solar cells, the plurality of wiring members comprises (i) a first plurality of wiring members disposed on the first side of the solar cell, and (ii) a second plurality of wiring members disposed on the second side of the solar cell.

4. The solar cell module of claim 3, wherein, in the first electrode:

the plurality of finger electrodes are disposed perpendicularly to the first plurality of wiring members, and the plurality of contact pads are disposed at a crossing between a respective one of the plurality of finger electrodes and a respective one of the first plurality of wiring members.

5. The solar cell module of claim 3, wherein each of the first plurality of wiring members is arranged lengthwise along a respective one of the plurality of connection electrodes.

6. The solar cell module of claim 3, wherein, in the first electrode, each of the plurality of contact pads has a length or a width that is greater than a width of each of the plurality of finger electrodes.

7. The solar cell module of claim 3, wherein the plurality of finger electrodes and the plurality of contact pads are made of Ag.

8. The solar cell module of claim 3, wherein the second electrode comprises a plurality of bus electrodes disposed lengthwise along a direction of the second plurality of wiring members, and configured to transfer charge carriers from a semiconductor substrate of the solar cell to the second plurality of wiring members.

9. The solar cell module of claim 8, wherein each of the plurality of bus electrodes of the second electrode are disposed perpendicularly to each of the plurality of finger electrodes of the first electrode.

10. The solar cell module of claim 8, wherein the second electrode is made of Al.

11. The solar cell module of claim 8, wherein the plurality of bus electrodes of the second electrode are made of Ag.

12. The solar cell module of claim 3, wherein each of the plurality of wiring members has a metal core and a solder coating layer on the metal core.

13. The solar cell module of claim 12, wherein the plurality of wiring members is soldered to at least one of the first electrode or the second electrode.

14. The solar cell module of claim 3, wherein each solar cell of the plurality of solar cells further comprises a semiconductor substrate having a pseudo-square shape with four inclined edge corners, and wherein the plurality of wiring members are arranged to not overlap any of the four inclined edge corners.

15. The solar cell module of claim 3, further comprising a connection terminal having a rectangular cross section to connect the first plurality of wiring members and the second plurality of wiring members of two adjacent strings of solar cells.

* * * * *